United States Patent [19]

Cioaca

[11] Patent Number: 5,355,347
[45] Date of Patent: Oct. 11, 1994

[54] SINGLE TRANSISTOR PER CELL EEPROM MEMORY DEVICE WITH BIT LINE SECTOR PAGE PROGRAMMING

[75] Inventor: Dumitru Cioaca, Cupertino, Calif.

[73] Assignee: Turbo IC, Inc., San Jose, Calif.

[21] Appl. No.: 148,926

[22] Filed: Nov. 8, 1993

[51] Int. Cl.$^5$ ............................ G11C 8/00; G11C 7/00
[52] U.S. Cl. ............................ 365/230.08; 365/189.05; 365/230.03
[58] Field of Search .................. 365/230.08, 230.03, 365/189.05

[56] References Cited

U.S. PATENT DOCUMENTS

| 4,811,294 | 3/1989 | Kobayashi et al. | 365/230.08 X |
| 4,943,962 | 7/1990 | Imamiya et al. | 365/230.08 |
| 5,204,841 | 4/1993 | Chappell et al. | 365/230.05 |
| 5,247,485 | 9/1993 | Ide | 365/230.01 |
| 5,323,355 | 6/1994 | Kato | 365/230.01 |

OTHER PUBLICATIONS

Masuoka, Fujio et al.; "A 256-kbit Flash E²PROM Using Triple-Polysilicon Technology", *IEEE Journal of Solid-State Circuits*, vol. SC-22, No. 4 (Aug. 1987).
Cioaca, Dumitru et al.; "A Million-Cycle CMOS 256K EEPROM", *IEEE Journal of Solid-State Circuits*, vol. SC-22, No. 5 (Oct. 1987).
Nakayama, Takeshi et al.; "A 5-V-Only One-Stransistor 256K EEPROM with Page-Mode Erase", *IEEE Journal of Solid-State Circuits*, vol. 24, No. 4 (Aug. 1989).
McConnell, Mike et al.; "An Experimental 4-Mb Flash EEPROM with Sector Erase", *IEEE Journal of Solid-State Circuits*, vol. 26, No. 4 (Apr. 1991).
Momodomi, Masaki et al.; "A 4-Mb NAND EEPROM with Tight Programmed $V_t$ Distribution", *IEEE Journal of Solid-State Circuits*, vol. 26, No. 4 (Apr. 1991).

Primary Examiner—Eugene R. LaRoche
Assistant Examiner—Son Dinh
Attorney, Agent, or Firm—Claude A. S. Hamrick

[57] ABSTRACT

An EEPROM memory array divided into a plurality of sectors having R word lines with each sector containing S bit lines, for a total of R×S bit-line/word-line intersections. At each intersection there is a single transistor EEPROM memory cell with its drain connected to a bit line and its gate connected to a word line. The sources of all the cells in each sector are interconnected to a sector select line. The Fowler-Nordheim tunneling mechanism is used to accomplish erase and write operations to the memory cells. The embodiment also includes a data latch array having R data latch rows, each of which is dedicated to storing a group of S data bits to be serially written into cells of the memory via a particular one of the R word lines. A data input-output buffer has S data inputs for supplying groups of S data bits in sequential steps to S latches within each of the data latch rows, to form S columns of R data bits within the data latch array. The EEPROM memory has sector and bit line select circuitry to activate a particular sector, de-activate the others, and select a particular bit line within a sector. During the write operation the bit line and sector select circuitry work together with high voltage pump circuitry, memory control logic, timing circuitry, and address circuitry to cause each column of R data bits in the data latch array to be passed via the R word lines and written into the R cells connected to a selected bit line. This writing of R cells via the word lines is done in a single step to the cells connected to the particular bit line; the next column of latched data being written into the memory cells corresponding to another bit line until the entire sector is written.

26 Claims, 15 Drawing Sheets

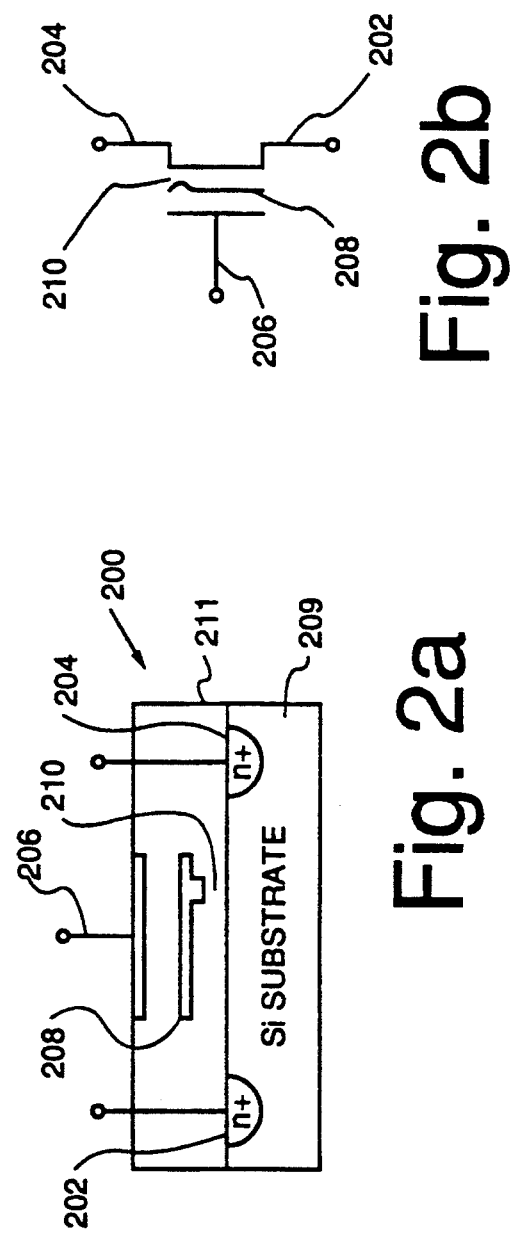

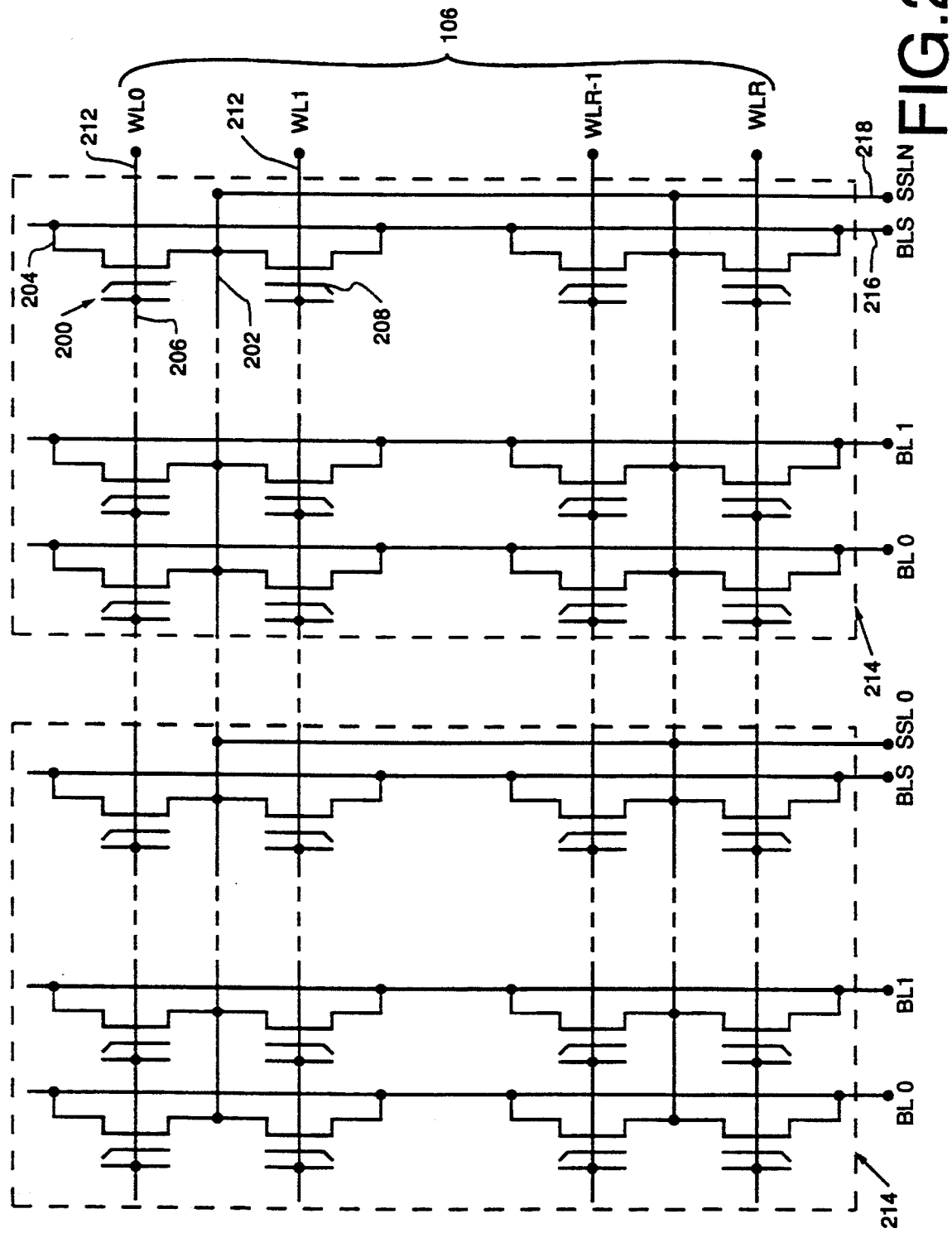

| CIRCUIT CONNECTION | BIT LINE | SSL | WORD LINE | COMMENTS |
|---|---|---|---|---|
| OPERATION | DRAIN | SOURCE | CONTROL GATE | |
| ERASE | FLOATING | 0V | VPP | F-N TUNNELING-ELECTRONS TUNNELED TO FLOATING GATE |
| WRITE | VPP | FLOATING | 0V | F-N TUNNELING-ELECTRONS TUNNELED OUT OF FLOATING GATE |
| | VPP | VPI | VPI | NO F-N TUNNELING |
| WRITE INHIBIT | FLOATING | FLOATING | VPP | NO F-N TUNNELING |
| | FLOATING | FLOATING | VPI | |
| READ | 2-3V | 0V | VCC | |

Fig. 10

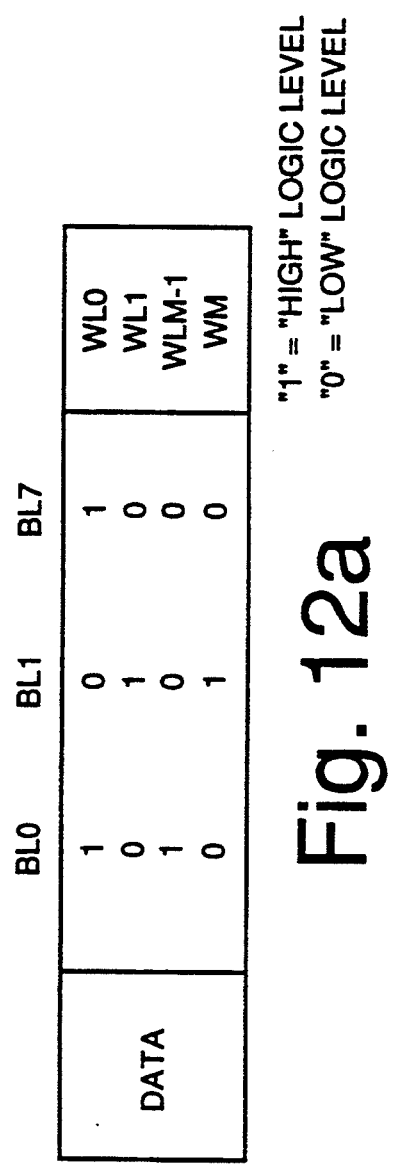

SINGLE TRANSISTOR PER CELL EEPROM MEMORY DEVICE WITH BIT LINE SECTOR PAGE PROGRAMMING

BACKGROUND OF THE INVENTION

1. Field of the Invention

The present invention relates generally to EEPROM transistor cell memories, and more particularly to a nonvolatile single EEPROM transistor cell memory divided into sectors having sector erase, and providing for the transfer of data to the cells by way of the word lines, resulting in bit line sector page programing.

2. Description of the Prior Art

Electrically Erasable Programmable memories are well known in the art. In "A Million-Cycle CMOS 256K EEPROM" by D. Cioaca et al, *IEEE Journal of Solid State Circuits*, Vol. SS-22, No. 5, Oct. 1987, a device is described using a two transistor cell for each bit of information. The memory cell state selection in this type of device is achieved by Fowler-Nordheim tunneling of charges between a floating gate and a silicon substrate through a very thin dielectric, or between the floating gate and control gate through the interpoly oxide. EEPROM memories using Fowler-Nordheim tunneling only require a single external power supply providing 5 volts or 3 volts. The higher voltages necessary for programming can be produced internally. Although the use of a single power supply is an advantage, two transistors per memory cell are needed, making them relatively expensive.

Another type of device, known as "Flash EPROM" is disclosed in U.S. Pat. No. 4,698,787 and uses only one transistor per cell. It is programmed like an EPROM and is erased like a EEPROM, but requires a high programming current which makes it difficult to use. In addition, the mechanism used to program the Flash EPROM causes hole trapping in the dielectric separating the floating gate from the substrate. The trapped holes lead to inadvertent electron tunneling from the floating gate, resulting in destruction of stored data.

An approach using a single EEPROM transistor cell is disclosed by Hakaiama et al in "A-5V-Only One Transistor 256K EEPROM with Page-Mode-Erase", *IEEE Journal of Solid State Circuits*, Vol 24, No.4, August 1989. Fowler-Nordheim tunneling is used for both the erase and write operations. Unfortunately, the cell size is larger than the Flash EPROM cell because for every bit line a separate metal line for VSS is required.

Another similar device is disclosed by McConnel et al in "AN Experimental 4 Mb Flash EEPROM With Sector Erase", *IEEE Journal of Solid State Circuits*, Vol. 26, No. 4, April 1991. As in the Hakaiama approach, a separate VSS line is required for every bit line, resulting in the cell size being larger than in the Flash EPROM cell.

Momodoni et al in "A 4 Mb NAND EEPROM With Tight Programmed VT Distribution", *IEEE Journal of Solid State Circuits*, Vol.26, No. 4, April 1991, reveals a device with EEPROM cells connected in series. The series connection has the advantage of small size, but results in slow memory speed due to an excessively small cell current during the read operation.

SUMMARY OF THE INVENTION

It is therefore an object of the present invention to provide a more compact single transistor cell EEPROM memory.

Another object of the present invention is to provide a high speed EEPROM memory.

A still further object of the present invention is to provide a single transistor cell EEPROM memory that operates from a single power supply voltage.

A further object of the present invention is to provide a single transistor EEPROM memory that supplies the data to the cells through the memory matrix word lines.

Briefly, a preferred embodiment of the present invention includes an EEPROM memory array divided into a plurality of sectors having R word lines with each sector containing S bit lines, for a total of R×S bit-line/word-line intersections. At each intersection there is a single transistor EEPROM memory cell with its drain connected to a bit line and its gate connected to a word line. The sources of all the cells in each sector are interconnected to a sector select line. The Fowler-Nordheim tunneling mechanism is used to accomplish erase and write operations to the memory cells.

The embodiment also includes a data latch array having R data latch rows, each of which is dedicated to storing a group of S data bits to be serially written into cells of the memory via a particular one of the R word lines. A data input-output buffer has S data inputs for supplying groups of S data bits in sequential steps to S latches within each of the data latch rows, to form S columns of R data bits within the data latch array.

The EEPROM memory has sector and bit line select circuitry to activate a particular sector, de-activate the others, and select a particular bit line within a sector. During the write operation the bit line and sector select circuitry work together with high voltage pump circuitry, memory control logic, timing circuitry, and address circuitry to cause each column of R data bits in the data latch array to be passed via the R word lines and written into the R cells connected to a selected bit line. This writing of R cells via the word lines is done in a single step to the cells connected to the particular bit line; the next column of latched data being written into the memory cells corresponding to another bit line until the entire sector is written.

An advantage of the present invention is that it provides a more compact EEPROM memory, because only one transistor per memory cell is required, and all VSS lines of a given sector are interconnected requiring only one source line per sector.

Another advantage is that it requires only a single power supply voltage as a result of using a memory cell using Fowler-Nordheim tunneling.

A still further advantage is that the present invention provides higher speed during the memory read operation as a result of each cell being directly biased rather than having cells connected in series, as in one prior art device which achieved small size, but not high speed.

A still further advantage is that the present invention provides a high programming speed due to all the cells of a bit line being programmed in a single step.

A still further advantage of the present invention is that it is an inexpensive memory device due to only one transistor being required per memory cell.

These and other objects and advantages of the present invention will no doubt become apparent to those skilled in the art after reading the following detailed description of the preferred embodiment illustrated in the several figures of the drawing.

IN THE DRAWING

FIG. 2A illustrates an EEPROM memory cell;

FIG. 2B is a schematic diagram depicting the EEPROM memory cell of FIG. 2A;

FIG. 2C shows the arrangement of memory cells in the sector organized EEPROM memory matrix of FIG. 1;

FIG. 10 is a tabulation of the voltages input to the EEPROM cells during the erase, write and read operations;

FIG. 12A is a tabulation of an example set of data to be programmed into the memory matrix of FIG. 1;

DETAILED DESCRIPTION OF THE PREFERRED EMBODIMENTS

Figure 1:
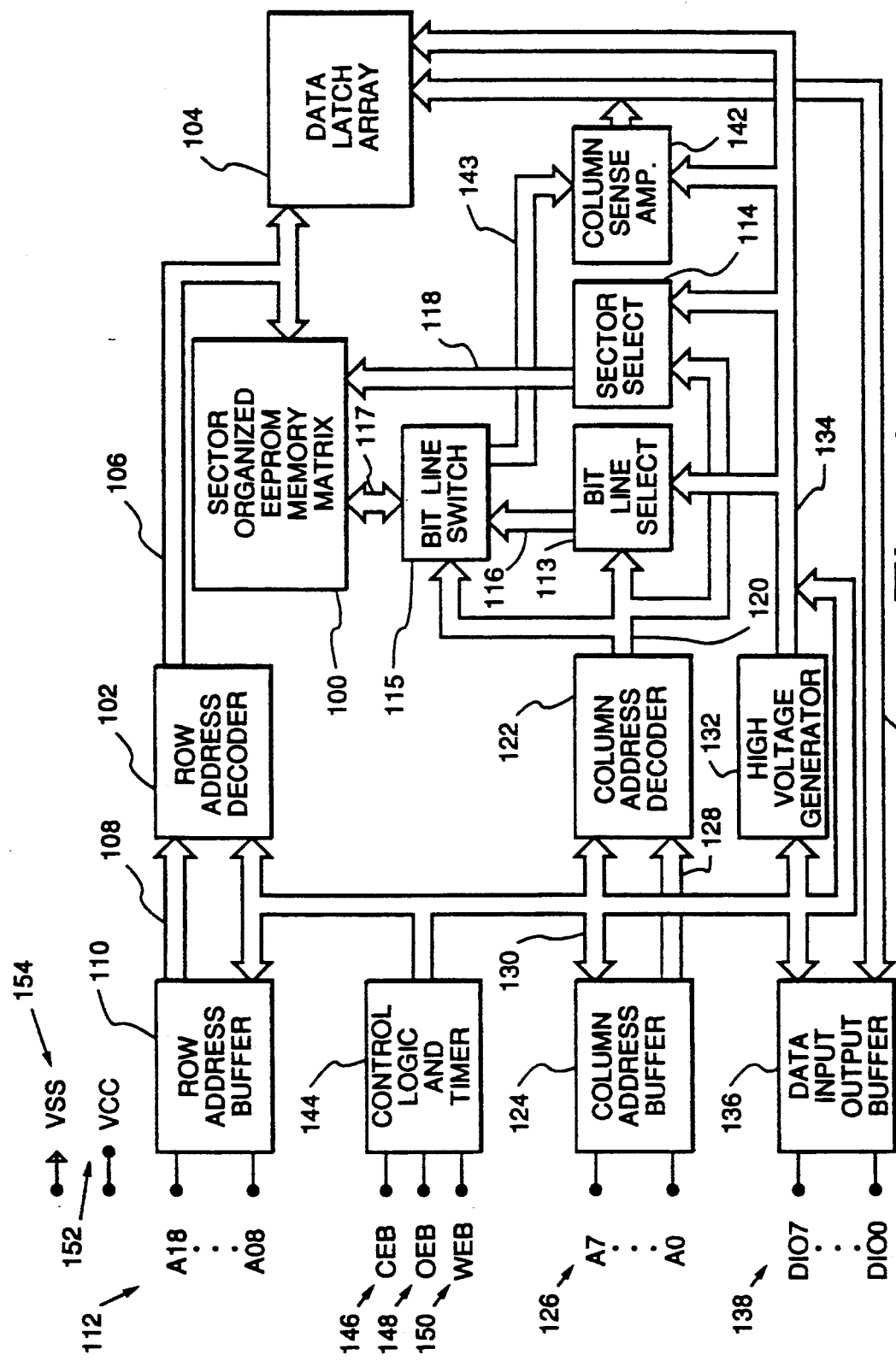
FIG. 1 is a block diagram generally depicting an EEPROM memory system in accordance with the present invention.

Referring now to FIG. 1, a preferred embodiment of the present invention is displayed in block diagram form and includes a sector organized EEPROM memory matrix 100, a row address decoder 102, and a data latch array 104, all interconnected by a bus line 106. The row address decoder 102 is interconnected through a bus line 108 to a row address buffer 110 having eleven inputs 112 (A8-A18). A bit line select circuit 113 and column sense amp 142 have access to the matrix 100 through bus lines 116 and 143, bit line switch circuit 115, and bus 117. The bit line select 113 and bit line switch 115 circuits communicate with the column address decoder 122 through bus line 120. The sector select circuit 114 is connected through bus line 118 to the memory matrix 100 and through bus line 120 to the column address decoder 122. A column address buffer 124 having eight inputs 126 (A0-A7) is interconnected through bus line 128 to the column address decoder 122. A high voltage generator 132 provides output through a bus line 134, which is joined by bus line 130 carrying signals, to communicate with the bit line select circuit 113, the sector select circuit 114, the data latch array 104, and the column sense amp 142. The high voltage generator 132 receives input from control logic and timer 144 via bus line 130. The data input-output buffer 136 has eight inputs/outputs 138 (DIO0-DIO7) and, in addition to connections to bus line 130, is connected to data latch array 104 and column sense amp 142 through data input/output bus line 140. Column sense amp 142 outputs data to the data input-output buffer 136 via bus line 140.

The control logic and timer 144 has a CEB (chip enable bar) input 146, an OEB (output enable bar) input 148, and a WEB(write enable bar) input 150 which provide control signals to row address buffer 110, row address decoder 102, column address buffer 124, column address decoder 122, data input output buffer 136 and high voltage generator 132 through bus line 130, and via bus lines 134 and 116 to bit line select 113, sector select 114, column sense amp 142, bit line switch 115, and data latch array 104. In addition, there are system interconnections (not shown) from the above described elements to the VCC supply voltage 152 and Vss ground inputs 154.

Now describing selected elements in further detail, the sector organized memory matrix 100 contains an array of word lines and bit lines, the bit lines being grouped according to corresponding memory sectors. Each intersection of a word line and a bit line contains an EEPROM cell, to be further explained in subsequent descriptions of the various figures of the drawing.

The row address buffer block 110 contains a set of eleven buffer elements equal in number to the number of inputs 112. It receives inputs 112, conditions them and provides eleven address signals and eleven inverted address signals for connection to the row(word line) address decoder 102. The row address decoder 102 provides $2^n$ (2048 for the illustrated case) word line signals to bus line 106 for input on n input lines to Memory 100 and data latch array 104.

The column address buffer block 124 contains eight buffers (one buffer for each input 126), generates eight address signals and eight inverted address signals (bus 128), which it then supplies to the column address decoder 122 which in turn generates $2^n$ sector select signals (bus 120) (equal to 256 for the eight inputs shown) and 256 inverted sector select signals which are sent to the bit line select circuit 113 and sector select circuit 114, and bit line switch circuit 115.

The bit line select circuit 113 and bit line switch 115 in cooperation respond to the sector select signals and to signals from the control logic and timer 144 to apply the appropriate voltages to the bit lines during read and programming operations. During the write step of the programming operation the bit line select circuit 113 and bit line switch 115 operate to select a particular bit line within a selected sector for receiving data from the data latch array, and to apply a deactivating voltage condition to the remaining bit lines of the selected sector and de-selected sectors. During the read operation the bit line select 113 and bit line switch 115 circuits operate in response to control signals from the control logic and timer 144 and column address signals from the column address decoder 122 to connect a particular set of bit lines of a selected sector to the column sense amp 142, which in turn outputs data to the data input/output buffer 136.

The sector select circuit 114 likewise responds to sector select signals and operates to apply the required voltages for selection and operation of a particular sector for the various operations of read, write and erase, and de-selects the other sectors.

The data input output buffer block 136 contains one buffer for each of inputs 138, equal to eight in the example illustrated, and generates a DIO output signal for each input, which is transferred to the data latch array 104 during the data loading operation. The buffer 136 also receives input from the column sense amp 142 during the read operation.

The control logic and programming timer 144 responds to input CEB, OEB and WEB signals and generates control and programming signals which are passed via bus 130 to the row address buffer 110, row address decoder 102, column address buffer 124, data input-output buffer 136, column address decoder 122, high voltage generator 132, and in addition also through bus 134 to the bit line select circuit 113, sector select circuit 114 and data latch array 104. Under control of logic circuit 144 the high voltage generator 132 provides high voltage programming signals transferred via bus 134 to the sector select circuit 114, the data latch array 104 and the bit line select circuit 113.

In operation, control signals are applied for timing the read and programming operations through inputs CEB (146), OEB (148) and WEB (150). A quantity of S data bits equal to the number of inputs 138 is received by the data input-output buffer 136, and as a group is transferred to and stored in a row of data latches in the data latch array 104. The associated circuitry of the rows of data latches will be more fully explained in the following descriptions of the various figures of the drawing. The procedure of transferring data to rows of data latches is repeated, storing row after row of data in the data latch array 104, until the array is filled with S columns of R rows of data bits, the number of R rows being equal to the number of R word lines in the memory matrix 100.

The data in the latch array 104 is then programmed into the memory 100 one latch array column at a time. The programming operation begins by selecting and erasing the contents of a particular sector of the memory 100. The sector select circuit 114 activates the selected sector and de-activates the others, and high voltage pump circuits in the data latch array 104 apply voltage to the word lines, resulting in the erase of the selected memory sector. In order to write the data into the memory, the bit line select circuit 113 then activates one bit line within the selected sector to receive data. The R memory cells connected to the selected bit line then receive programming voltages from the data latch array 104 to write the first column of R data into the R cells connected to the selected bit line. The bit line select circuit 113 then deactivates the first bit line and activates a second bit line to receive data, and the data latch array 104 applies voltages to the word lines to write the second column of R data bits, stored in the data latch array 104 into the R cells associated with the selected bit line. This procedure is then repeated until all the cells of the sector are written.

The memory access and read operations are performed with circuitry well known in the art and are not further detailed in this disclosure. These operations are implemented by the buffers (110, 124, 136), the control logic and timer 144, the decoders 102 and 122, the bit line select circuit 113, the bit line switch 115, the sector select circuit 114, and the column sense circuit 142.

The numbers of inputs, outputs and memory size as above detailed and in the following descriptions of the various drawings are given for illustrative purposes only and not by way of limitation, as the spirit of the invention applies to any size memory. The use of column and rows in description of the data in the data latch array is figurative in that other arrangements can also be used consistent with loading the data to the memory matrix via the word lines.

Referring now to FIGS. 2A, 2B and 2C, the elements and structure of the sector organized memory matrix 100 are disclosed. FIG. 2A is an illustration of the EEPROM cell 200 used in the memory 100. The transistor cell 200 has a source 202, a drain 204, a control gate 206, a floating gate 208 and a dielectric tunnel region 210. The dielectric layer within which the gate 206 and the floating gate 208 are disposed is suggested by the block 211. FIG. 2B shows the industry accepted schematic symbol for the type of EEPROM transistor preferred for use in the present invention.

FIG. 2C suggests the organization of the memory array. As will be further explained below, the array of memory cells is organized in a plurality of sectors 214 each of which is comprised of rows and columns of EEPROM storage sites corresponding in number and layout to the array of data latches contained in the data latch array of 104. Each of the sectors 214 is intersected by a series of R word lines (WL) 212, and S bit lines (BL) 216. The number of bit lines per sector is equal to the number of data input-output lines 138(FIG. 1). Each word line 212 crosses every bit line 216, and a single transistor EEPROM memory cell 200 is located at each crossing. Each cell 200 has its drain 204 connected to the crossing bit line 216 and its gate connected to the crossing word line 212. Within each sector 214, all of the cells 200 have their sources 202 connected in common to a single sector select line (SSL) 218. Each of the word lines (WL0-WLR) 212 is connected to a row of data latches in the data latch array 104(FIG. 1), to be more fully explained in the following. Each of the bit lines 216 is connected to the bit line select circuit 113 through bus lines 116 and 117 and bit line switch 115, and connection from the bit line is also made to the column sense amp 142 through the data output bus 143, bit line switch 115 and bus 117.

Figure 3:
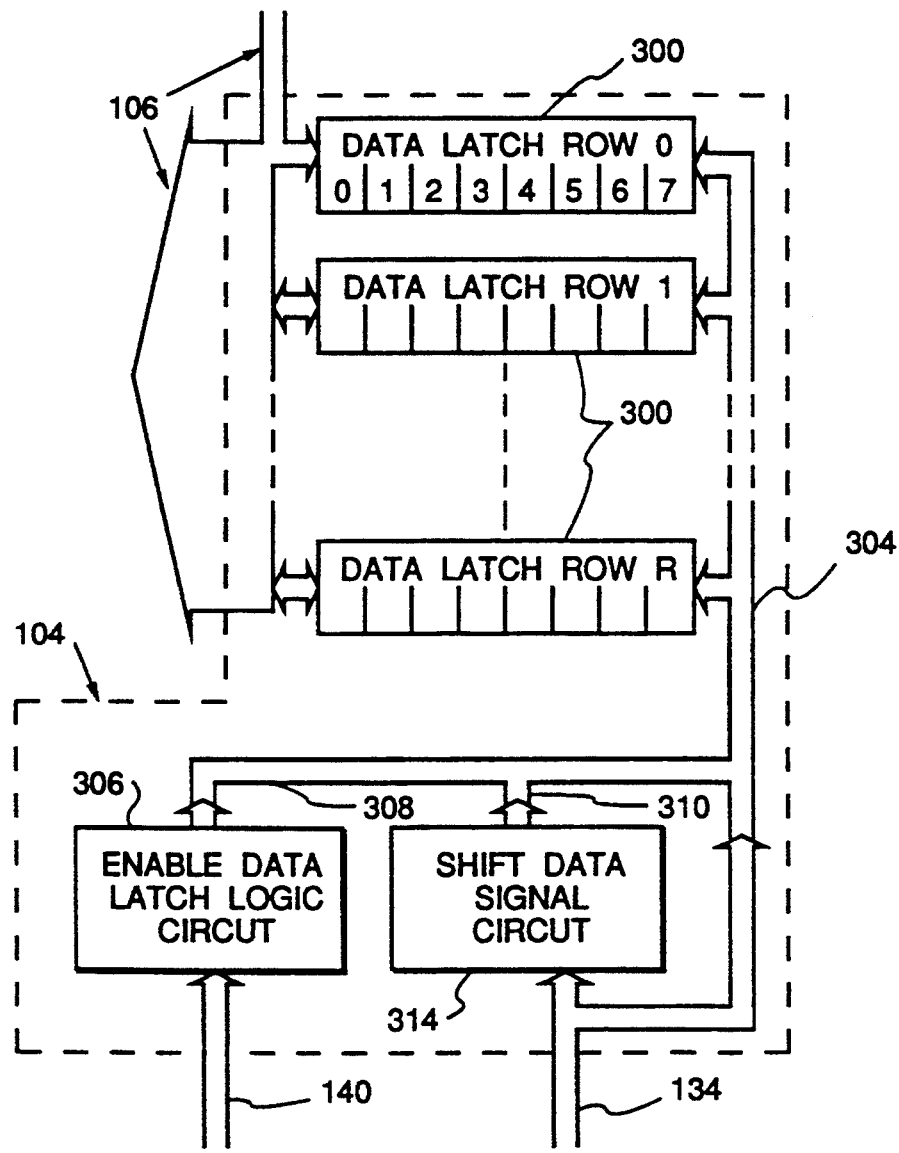
FIG. 3 illustrates the arrangement of data latch rows, enable data latch logic circuitry, and shift data signal circuitry within the data latch array illustrated in FIG. 1.

Referring now to FIG. 3, there is shown a somewhat more detailed illustration of the data latch array 104. For each of the R word lines 212 contained in bus line 106 and leading to the array sectors 214 (FIG. 2C), there is a data latch row 300. Each data latch row 300 receives word line activation signals from the row address decoder 102(FIG. 1), and makes connection with a corresponding word line 212 via bus line 106. Various voltages and control logic signals are received from generator 132 and control logic 144 through bus lines 134 and 304, and include the following:

SW—sector write signal (from control logic & timer 144)

LARS—latch array reset signal (from control logic & timer)

CL—clock signal (from high voltage generator 132)

SEB—sector enable bar (from control logic & timer 144)

EPHV—enable programming high voltage signal (from control logic & timer 144)

VPP—high voltage (from high voltage generator 132)

VPI—programming inhibit voltage (from high voltage generator 132)

P1, P2, ... P(S-1)—data shift control signals (from control logic & timer 144)

FIG. 3 also shows an enable data latch logic circuit 306 with bus 140 input and bus 308 output, and a shift data signal circuit 314 with an input from bus 134 and an output to bus 310.

Each of the data latch row circuits 300, in response to an activated word line 212 acting as a latch activation signal, receives and stores in one step during the data loading procedure, a group of S data bits equal to the number of bit lines per sector 214, and equal to the number of inputs 138 of the data input-output buffer 136(FIG. 1). In the illustrated example, S equals 8. The data latch row circuits 300 also generate and apply the appropriate voltages to each word line 212 for the erase, and write operations in response to the stored data and control signals received via bus lines 106 and 304.

The enable data latch logic circuit 306 allows the transfer of a group of S data signals (DIO0B-DIO7B) from the input-output buffer 136 via bus line 140, and sends them to the latch circuits 300 in response to signals generated by the control logic and timer 144, to be more fully described below.

The shift data signal circuit 314 receives signals from the control logic and timer circuit 144 via bus 134 to provide output signals to the data latch rows 300, to move one column of latched data at a time into a first latch position from which the appropriate data voltages can be applied to each word line to write the data into the memory cells of a memory sector connected to a selected bit line.

In operation, a LARS (latch array reset signal) clears the data from the data latch row circuits 300 in response to direction from the control logic and timer 144, preparing them to receive new data. A group of S data is then applied to the S inputs 138 of the input-output buffer 136 (FIG. 1), and the row address buffer 112 in conjunction with the control logic and timer 144 directs a word line activation signal to a selected word line 212 to allow one and only one data latch row 300 to receive the input data. Then an EDLB (enable data logic) signal is sent to the enable data logic circuit 306 to allow the transfer of the group of S data bits to the selected data latch row circuit 300 via bus lines 140, 308 and 304. The row address buffer 102 in conjunction with control logic and timer 144 then causes the deactivation of the word line 212 and the enable data latch logic circuit 306. A second group of S memory data bits is then applied to the data input-output buffer 136, a second word line is activated and the process is repeated until all of the data latch rows 300 are loaded.

The data latch row circuits 300 function in the transfer of data to the memory cells 200 of the sectors 214 as follows. During the sector erase operation, occurring before sector write, the data latch row circuit 300 applies the high voltage VPP to the word lines 212 applying the voltage to the gates of the memory cells. At the same time, the sector select and bit line select circuits 114 and 113 cause the voltage on the bit lines to float and a zero voltage to be applied to the sources of the selected sector; to be explained more fully in the following. As a result, all EEPROM cells of the selected sector are conductive (on), causing the drains of the EEPROM cells in the selected sector to be electrically connected to the sources of the cells which are at a zero voltage level so that a Vpp voltage is applied from the gate to drain of each cell, causing Fowler-Nordheim tunneling to the floating gate 208, and placing all the selected cells in an erased state.

During the memory write operation, the control logic and timer 144 directs the column address decoder 122 to activate a particular memory bit line 216 of the selected sector to receive data, and deactivates the other bit lines. The data latch row circuits 300 transfer the data that is first in line (in each latch row) to be written into memory by applying a zero voltage to the corresponding word line if the data is low (logic level "0"), and applying a VPI voltage to the word line if the latched data bit is high (logic level "1"). Definition of these voltages and how they are used will be more fully explained in the following.

There are a total of R data latch rows 300, with each row 300 as previously indicated containing S latches, forming an array of S columns of R latches per column. In accordance with the present invention, all of the data bits (R in number) in the first column are simultaneously written via word lines 212 into the R memory cells of a selected sector that are intersected by both the word lines and a particular selected bit line. Following the writing of the data in the first column of latches into the selected bit line of the selected sector, the shift data signal circuit 314 moves the data in the second latch column into the first column position and the above writing procedure is repeated, whereafter the shift data signal circuit 314 moves the next data into the first position, etc., until all of the data in the data latch array 104 is stored in the selected memory sector. Following this, the data loading procedure as described above is repeated for another sector, as required, and the entire process of loading the data latch row circuits and writing into memory is repeated until all of the sectors to be programmed are loaded with data.

Figure 4:
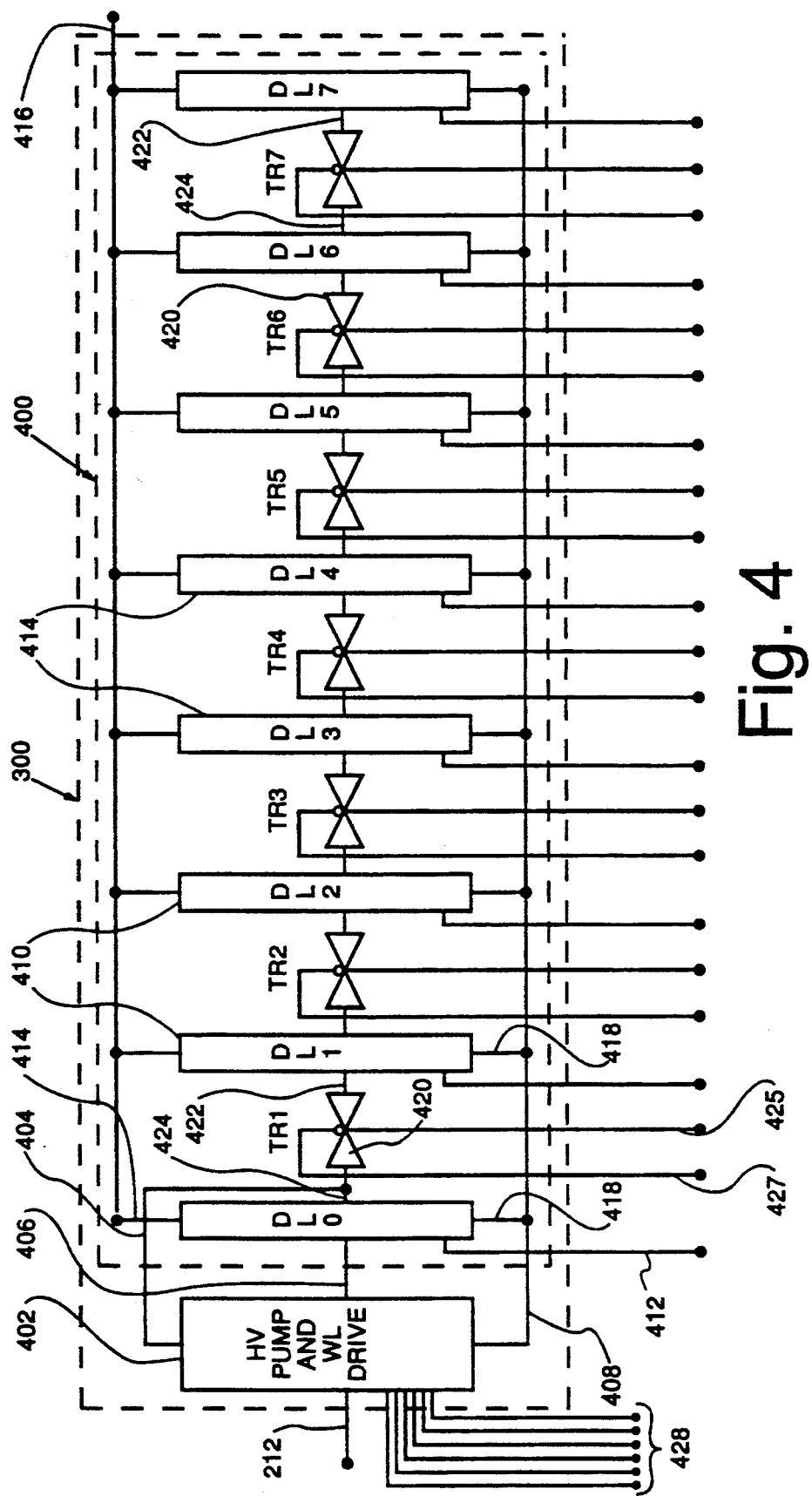
FIG. 4 depicts the components associated with each row of the data latch of FIG. 3.

Referring now to FIG. 4, a more detailed diagram of a preferred embodiment of the data latch row circuitry 300 is shown to include a data row array 400 and a high voltage pump and word line drive circuit 402. The drive circuit 402 is interconnected to the latch array 400 by a bypass input 404, input 406 and a word line activation input 408. The data row array 400 contains a total of eight latches (DL0-DL7) 410. The number is not limited to eight, but must be equal to the number of bit lines in a memory sector. Each latch 410 has a data input 412 for receiving one of the data input signals (DI0B-DI7B) from the enable data latch logic circuit 306. All of the latches 410 have a latch array reset signal (LARS) input 414, connected to a common LARS signal input 416, and all have an activation input 418, all connected in common to input 408. A series of transmission gates 420 switchably interconnect the output 422 of one latch with the input 424 of the next latch upon direction of signals SD1-SD8 and SD1B-SDSB (from the shift data signal circuit 314) applied to transmission gate inputs 425 and 427 respectively. The last output 422 (of latch DL0) is switchably connected through drive circuit 402 to word line 212.

The drive circuit 402 has input signals 428 including VPP/VPI, EPHV, VPP, CL, SW and SEB, as defined above in connection with FIG. 3, in addition to the inputs from the data row array 400. In response to the various control and supply signals, each circuit 402 provides output signals to a particular word line 212.

Each word line 212 is a part of bus 106 (FIG. 3), while the lines 412, 416, 425, 427 and 428 form part of bus 304.

In operation, as explained above, a latch array reset signal is applied on line 416 to clear the latches 410 of data. Then an activation word line signal 212 is applied to driver 402 which activates line 418 to allow the latches 410 to receive data. A new set of S data bits from the data input output buffer 136 (FIG. 1) is then passed to the latches 410 in a single step upon activation of the enable data latch logic circuit 306. This process is repeated as each of the R rows of latches is loaded with data.

With the latches 410 loaded with data, the array 104 (FIG. 1) further functions to provide signals for sector erase and write operations. Upon receipt of appropriate signals on lines 428, each drive circuit 402 applies the correct voltage to the associated word line 212 to initiate the sector erase operation, and then responds to the data stored in the first latches DL0 of each row of latches 300 and applies the correct voltages to the R word lines 212 to write either a "1" or "0" data bit in memory according to the data value. The transmission gates 420 then receive signals SD1–SD7 and SD1B–SD7B on inputs 425 and 427 (from the shift data signal circuit 314) to shift the data in the latches so that the latch DL1 data is stored in the DL0 latches. The circuits 402 then respond to signals on lines 428 and the new data in latches DL0 and apply the appropriate corresponding data bit voltages to the word lines 212. This process is then repeated until all the data has been shifted through the latch array and loaded into memory and the active sector 214 is filled.

Figure 5B:
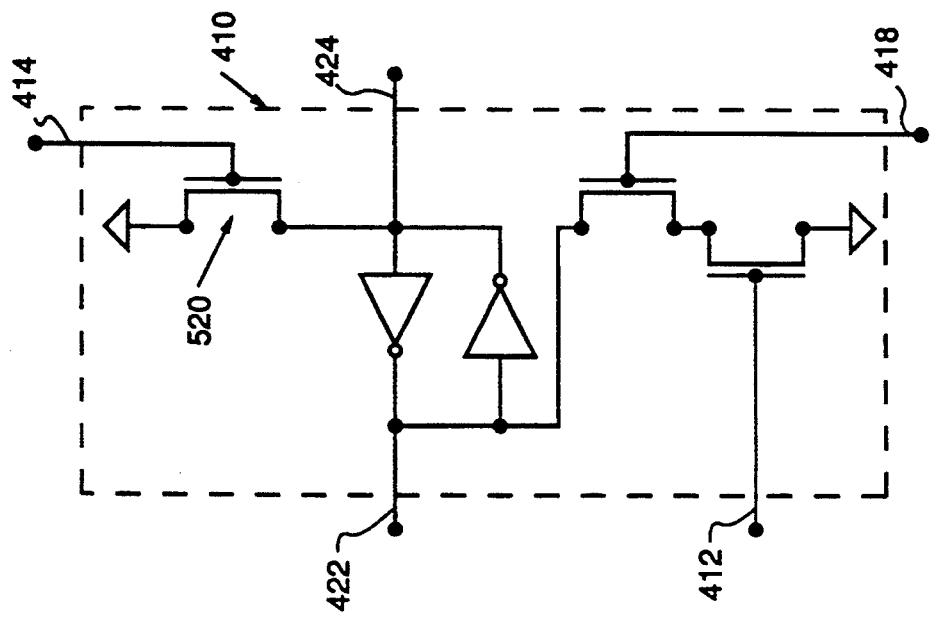
FIGS. 5A and 5B illustrate two types of data latch circuitry depicted in FIG. 4.
Figure 5A:
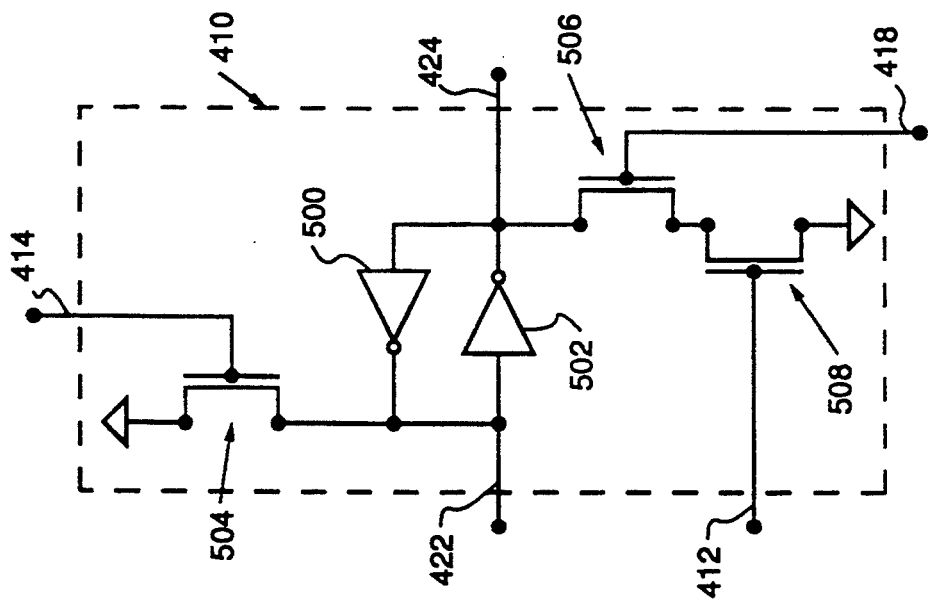

FIGS. 5A and 5B show two types of latch configurations that can be used for the data latches 410 of FIG. 4. FIG. 5A shows a latch 410 with a powerful inverter 500, a weak inverter 502, and three n channel transistors 504, 506 and 508. The circuit includes an input 424, an output 422, a data input 412, a word line enable/disable input 418, and a reset signal input 414.

In operation, a reset signal is applied to input 414 to activate transistor 504 and pull output 422 to a "0" logic level, and by way of inverter 502 pull input 424 to a "1" logic level. The reset signal is then removed and a word line enable/disable signal is applied to input 418 to activate transistor 506. The memory data is then applied to input 412, either turning transistor 508 "on", or leaving it "off" depending on whether the data is "1" or "0". If it is "0", the logic states at 424 and 422 remain unchanged. If it is "1", transistor 508 conducts, pulling the signal at 424 to "0" logic level, forcing the inverter 500 to change the state at output 422 to a "1" logic level.

FIG. 5B shows another data latch, similar to that of FIG. 5A except that the reset transistor 520 sets the input 424 instead of the output 422. The operation of the two circuits is similar. The circuits in FIG. 5A and FIG. 5B are both used in the data latch row 400 (FIG. 4). DL0, DL2, DL4 and DL6 are latches of the type shown in FIG. 5A. DL1, DL3, DL5 and DL7 are latches of the type shown in FIG. 5B.

Figure 6:
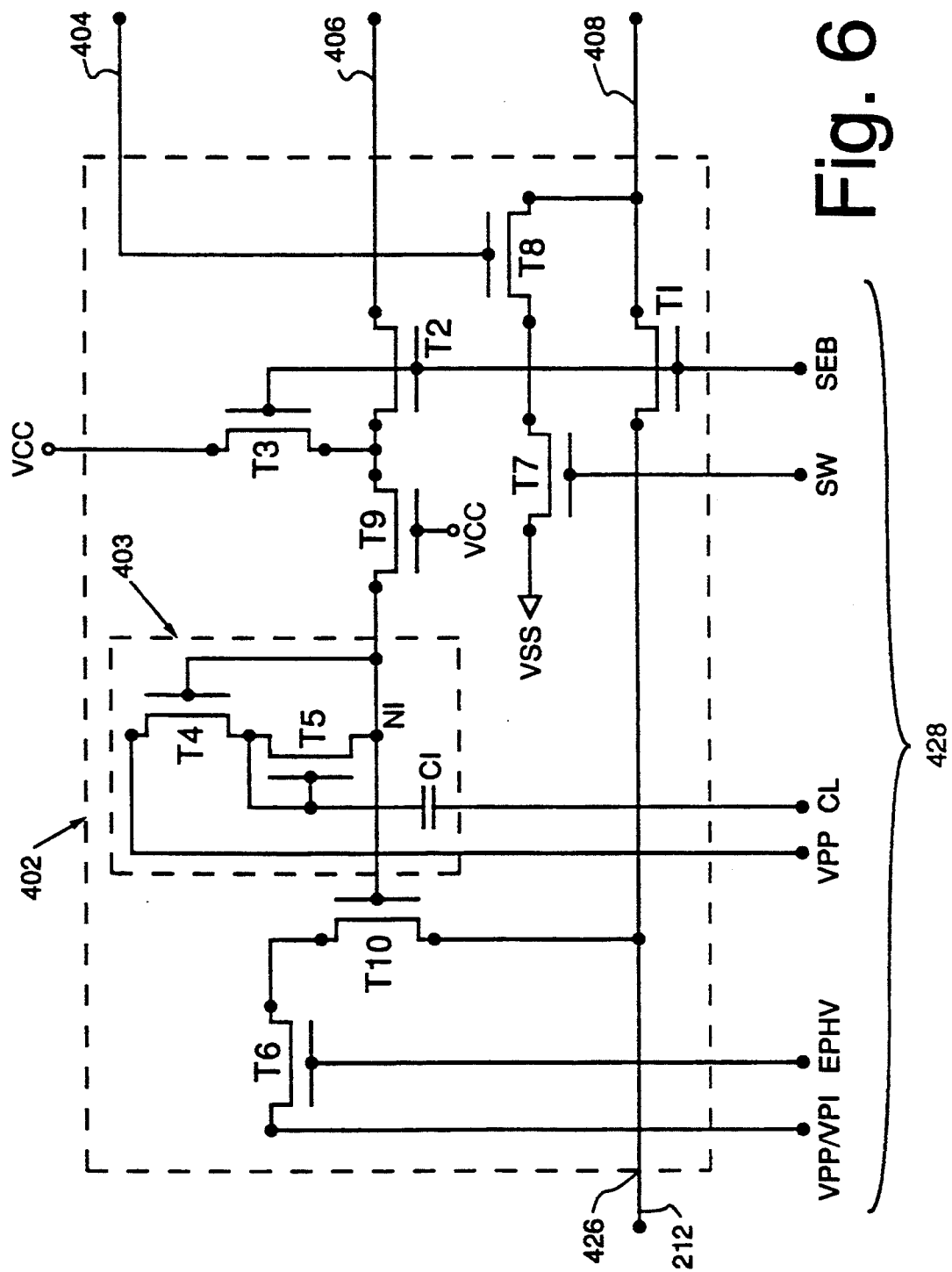
FIG. 6 shows detail of the high voltage pump and word line drive circuit of FIG. 4.

FIG. 6 shows the detail of a preferred embodiment of the high voltage pump and word line activation circuit 402 of FIG. 4. This circuit has three distinctive functions as follows:

a) to allow a signal on word line 212 to serve as an activating input signal, resulting in a corresponding signal on line 408 for activating the data latches 410 to receive data during the data loading operation;

b) to provide the word line 212 with a VPP voltage level during the sector erase operation; and c) to take the data logic level from output 422 of latch DL0 through signal input 406 and convert the data to a corresponding high voltage level VPI when the data logic level is "1" and to a zero voltage level when the data logic level is "0", and to apply one of these voltages to the word line 212 during the sector write operation.

The generation of high voltage levels is done by the high voltage pump circuit 403 made up of transistors T4 and T5 and capacitor C1. The way the high voltage pump works is well known in the art and is not further detailed here. The high voltage pump 403 transfers the high voltage VPP to node N1 if at the starting point of the transfer operation node N1 is at logic level "1" (approximately VCC) and the clock CL is active. If node N1 is at logic level "0" (approximately VSS) and the clock signal is active, the high voltage pump 403 can not transfer the VPP voltage to node N1 and this node will stay at "0" logic level. If the clock CL is not active, no high voltage transfer takes place between VPP and N1.

The circuit 402 also includes a bypass input 404 connected to the input of the first data latch DL0, an activation line 408, various control inputs 428 and an output 426 connected to the word line 212. There are nine "n" channel transistors T1, T2, T4, T5, T6, T7, T8, T9 and T10; one "p" channel transistor T3, and a capacitor C1. During the data load operation the selected word line 212 is connected with the activation input 408 through transistor T1, and the status of the signals at 428 detailed in FIG. 6 is:

```
VPP/VPI = "1" (approximately VCC)
EPHV = "0" (approximately zero)
     SW = "0"
VPP = "1" (approx. VCC)
 CL = not active
     SEB = "1"
```

Under these signal conditions the high voltage pump 403 is not active and the only signal the word line 212 is connected to is the data latch row activation line 408.

During the selected sector erase operation the signal configuration of circuit 402 (FIG. 6) is:
VPP/VPI = 15 to 20 volts
EPHV = 15 to 20 volts
VPP = 15 to 20 volts
CL = active
SW = "0" (approximately 0 volts)
SEB = "0" (approximately 0 volts)

Under these signal conditions during the sector erase operation, the transistors T1, T2 and T7 are non-conductive (cut off) and there is no electrical connection between the word lines 212 and the data latch row activating signal input 408. Node N1 is electrically isolated from a signal at input 406, but is connected to the VCC ["1"] voltage level through "n" channel transistor T9 and "p" channel transistor T3. The high voltage pump 403 pumps node N1 to a voltage level equal to the VPP signal voltage level (15V–20V). Both transistors T6 and T10 have 15 to 20 volts on their gates causing them to conduct and therefore connect the VPP/VPI signal to the word line 212.

During the sector write operation the signal configuration of circuit 402 (FIG. 6) is:
VPP/VPI = 6.5 to 10 volts EPHV=15 to 20 volts
VPP=15 to 20 volts
CL=active
SW=logic level "1" (approximately VCC)
SEB=logic level "1" (approx. VCC)

During this operation the data in latch DL0 (FIG. 4) is connected to node N1 through input 406 and transistors T2 and T9. At the same time inverted data (data bar) at the input to data latch DL0 is connected through input 404 to the gate of T8. With the data in latch DL0 at a "1" logic level, output 406 is at a "1" logic level and node N1 is pumped to the VPP voltage (15 to 20 volts). As a result, both transistors T6 and T10 have the Vpp voltage level (15 to 20 volts) on their gates and the signal Vpp/VPI voltage (6.5 to 10 volts) connected to word line 212. With output 406 at a logic "1", the input 404 is at logic "0" which is connected to the gate of transistor T8 causing it to be non-conductive, which means that for data="1" in data latch DL0 there is no electrical connection between word line 212 and VSS line through the transistors T1, T8 and T7. If the data in latch DL0 is "0", this data will pull node N1 to "0"through input connection 406, transistor T2 and T9, causing the high voltage pump 403 to be de-activated. As a result, node N1 stays at "0" level causing the gate of transistor T10 to be at a low voltage rendering transistor T10 non-conductive, and further resulting in no electrical connection between the VPP/VPI signal and word line 212. With the data="0" at input 406, data bar="1" at 404, and transistors T1, T8 and T7 are all conductive, resulting in the word line 212 being discharged to 0 volts.

Figure 7:
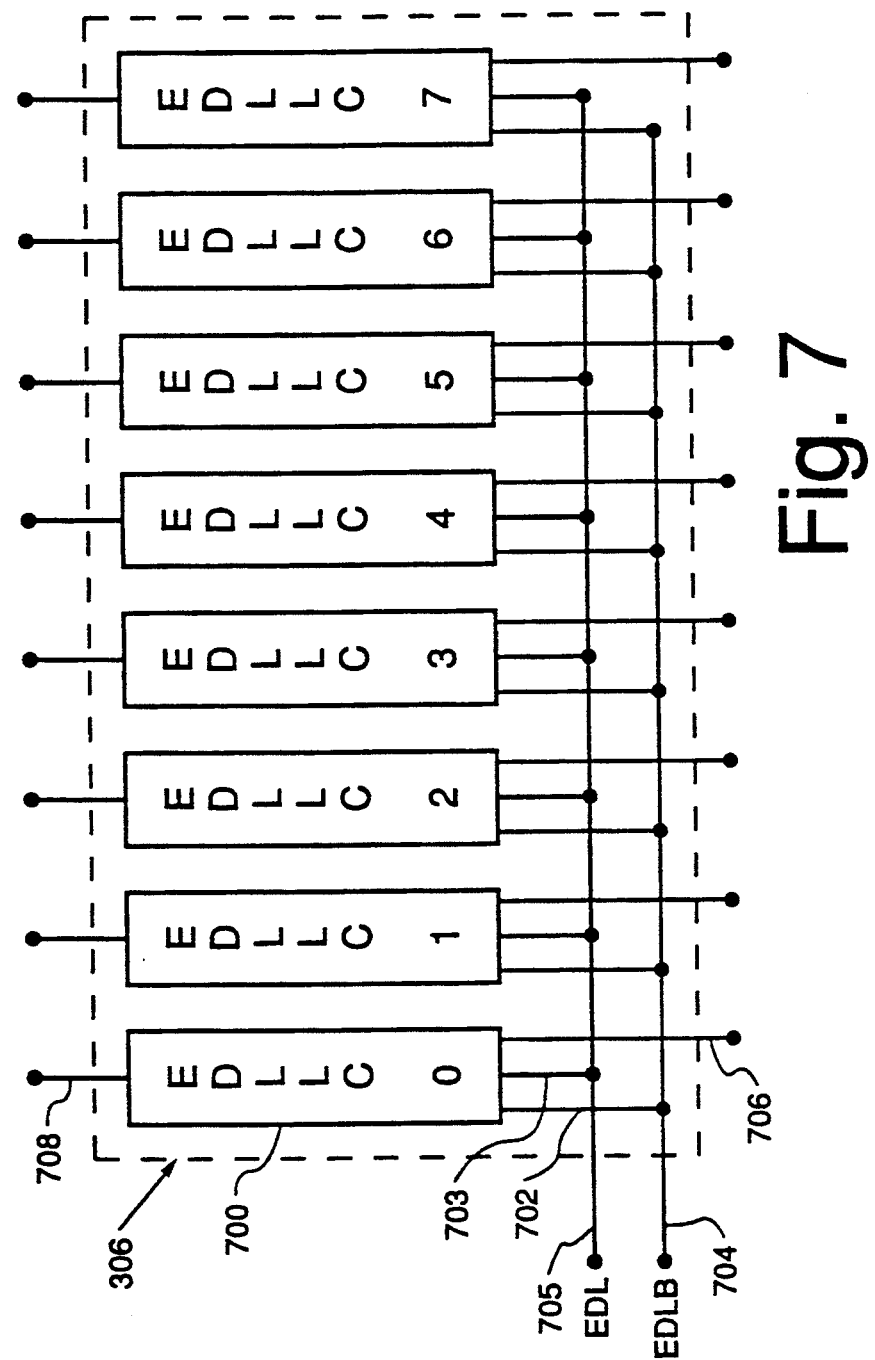
FIG. 7 is a block diagram depicting the several enable data latch logic circuits within the enable data latch logic circuit of FIG. 3.

FIG. 7 shows a more detailed description of the enable data latch logic circuit 306 which includes a total of eight enable latches 700 corresponding to the eight data latches 410 of FIG. 4. The number of latches 700 is not limited to eight, but must be equal to the number of data latches 410 which reflect the number of bit lines per sector 214 according to the particular memory design. Each enable data latch 700 has a latch enable bar input 702 and a latch enable input 703. All of the latch enable bar 702 inputs are connected in common to a EDLB input 704, and all of the latch enable inputs 703 are connected in common to a EDL input 705. Each enable latch 700 has a data output 708.

In operation, data (DI0B–DI7B) from the data input-output buffer 136 is applied to data inputs 706. Upon application of a "1" logic level signal to the EDL input 705 and a "0" logic level signal to EDLB input 704, the enable latches apply corresponding signals DI0B–DI7B at the data outputs 708, which are connected to inputs 412 of the data latches 410. When the EDL input 705 is "0" and the EDLB input 704 is "1", the enable latches 700 are de-activated.

Figure 8:
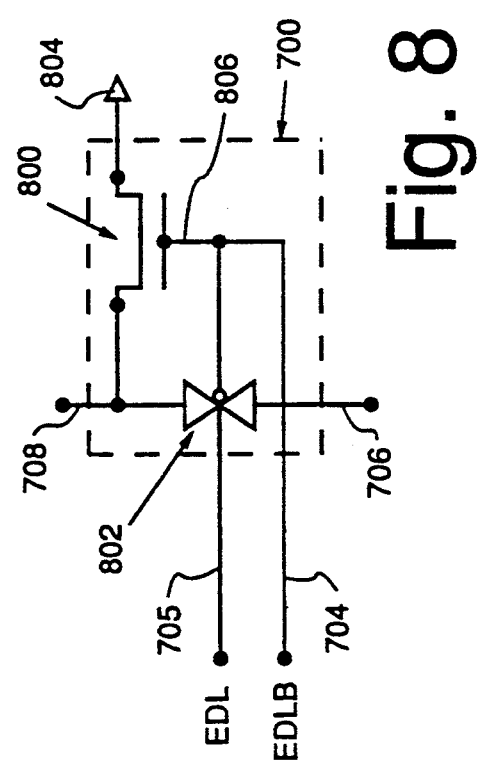
FIG. 8 is a diagram schematically illustrating an individual enable data latch logic circuit of FIG. 7.

FIG. 8 shows the detailed circuitry of a preferred embodiment of the enable latches 700. The circuit includes a transistor 800, and a transmission gate 802. Transistor 800 makes a source to drain connection between the circuit output 708 and ground 804 upon a "1" logic level application to the gate 806. The transmission gate 802 connects the input 706 to the output 708 with a "1" EDL (705) logic level and "0" EDLB (704) logic level.

In operation, "0" EDLB 704 and "1" EDL (705) logic levels turn the transmission gate 802 "on", allowing an input 706 data signal to be transferred to the output 708. The "0" EDLB 704 signal additionally renders transistor 800 inactive so as not to affect the output 708. With EDL "0" and EDLB "1", transmission gate 802 is turned off, disconnecting the input 706 and output 708. Additionally, the "1" EDLB turns transistor 800 on, applying a stable "0" level to output 708.

Figures 9A, 9B:
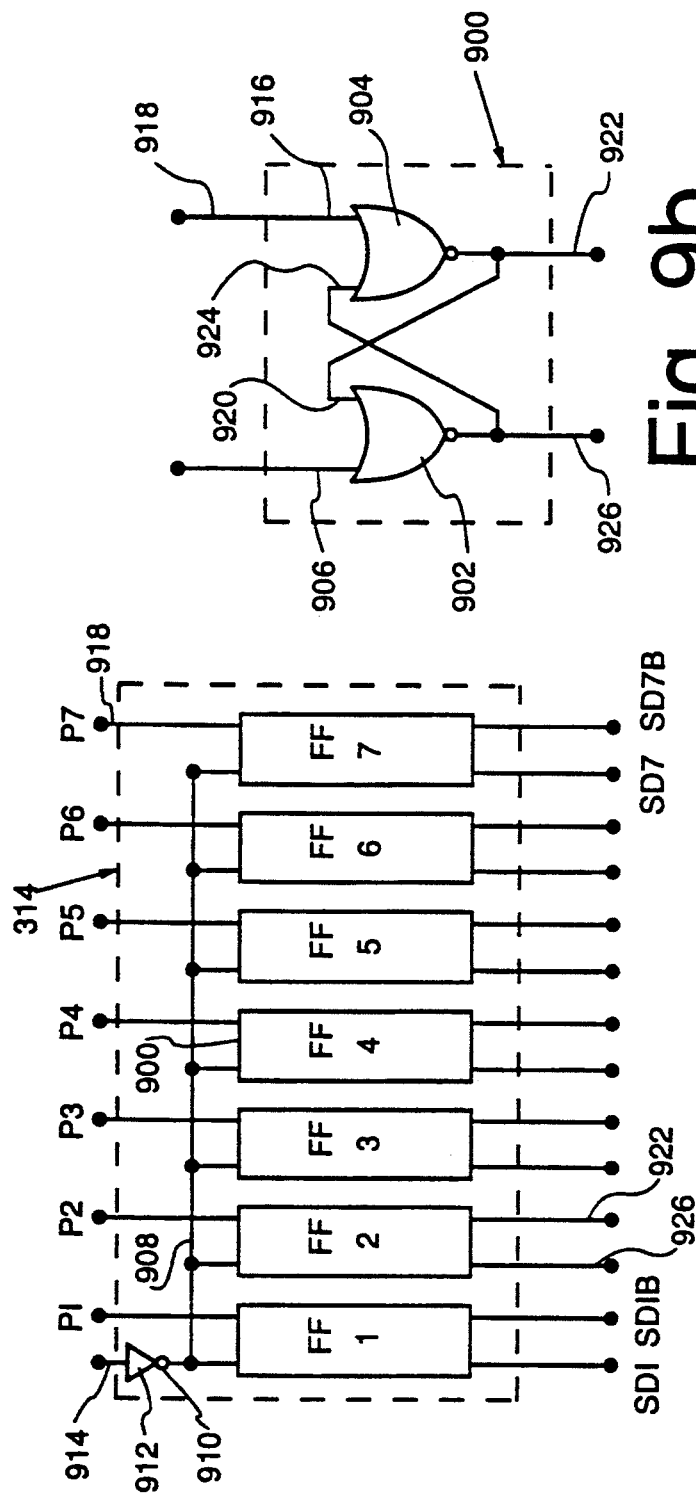
FIG. 9A is a block diagram showing the arrangement of flip-flop circuits within the shift data signal circuit of FIG. 3.
FIG. 9B is a diagram schematically illustrating an individual flip-flop circuit of FIG. 9A.

FIGS. 9A and 9B illustrate a preferred embodiment of the shift data signal circuit 314. A total of seven flip-flop circuits 900 are shown in FIG. 9A. As in the above examples, the invention is not limited to seven, but one flip-flop 900 is needed for each transmission gate 420. Each flip-flop circuit, as shown in FIG. 9B, is constructed from two NOR gates 902 and 904. A first input 906 of the NOR gate 902 is connected to a common line 908 of FIG. 9A, which is connected to the output 910 of invertor 912, the input 914 of which receives a SW (sector write) signal from the control logic and timer 144. A first input 916 (FIG. 9B) of the NOR gate 904 connects to an input 918 for receiving control signals P1–P7 from the Control Logic and Timer 144. The second input 920 of the NOR gate 902 is connected to output 922, and the second inputs 924 of the second NOR gate 904 is connected to the output 926 of the first NOR gate 902. The outputs 926 of the first NOR gates 902 provide signals SD1–SD7, and the outputs 922 of the second NOR gates 922 provide signals SD1B–SD7B.

In operation, an SW signal is used as a reset signal and is applied at input 914 to clear the flip-flops 900. Signals P1–P7 are provided by the memory timer 144 to inputs 918 and operate to control the flip-flop 900 state, changing the logic states of outputs 926 and 922, which in response determine the conducting or non-conducting status of the transmission gates 420, to which they are connected, so as to move the data sequentially to the first data latch DL0 in each Data Latch Row 300 for writing in the memory sector 214.

FIG. 10 is a table indicating the various voltages that must be applied to the source, drain, and gate of each memory transistor cell 200 in order to perform the memory functions of erase, write, read, and write inhibit. The voltage levels given should be considered relative between the source and drain and gate rather than absolute, and "floating" means that no voltage is applied, i.e, the contact is effectively disconnected. The abbreviation F-N means Fowler-Nordheim. The other voltages are defined as follows:

VPP—programming voltage, usually 15V to 20V
VPI—programming inhibit voltage, usually VPP/2
OV(VSS)—approximately zero volts Row 1000 contains the required voltages for erasing the cells of a selected sector, and row 1006 indicates the voltages applied to the non-selected sectors during the erase operation. For the write operation, the voltages to be applied are those of row 1002 when the data is "0", and row 1004 when the data is "1". The non-selected sectors receive the voltages of rows 1008 and 1010 during the write operation. Row 1112 gives the voltages required to read a cell. The bit line voltage of 2-3 volts is nominal, and is simply selected to indicate cell conduction when the cell is in the state having a lower threshold, and at the same time being of a lower voltage than what which would be required to cause conduction when the cell is in the higher threshold state.

Figure 11:
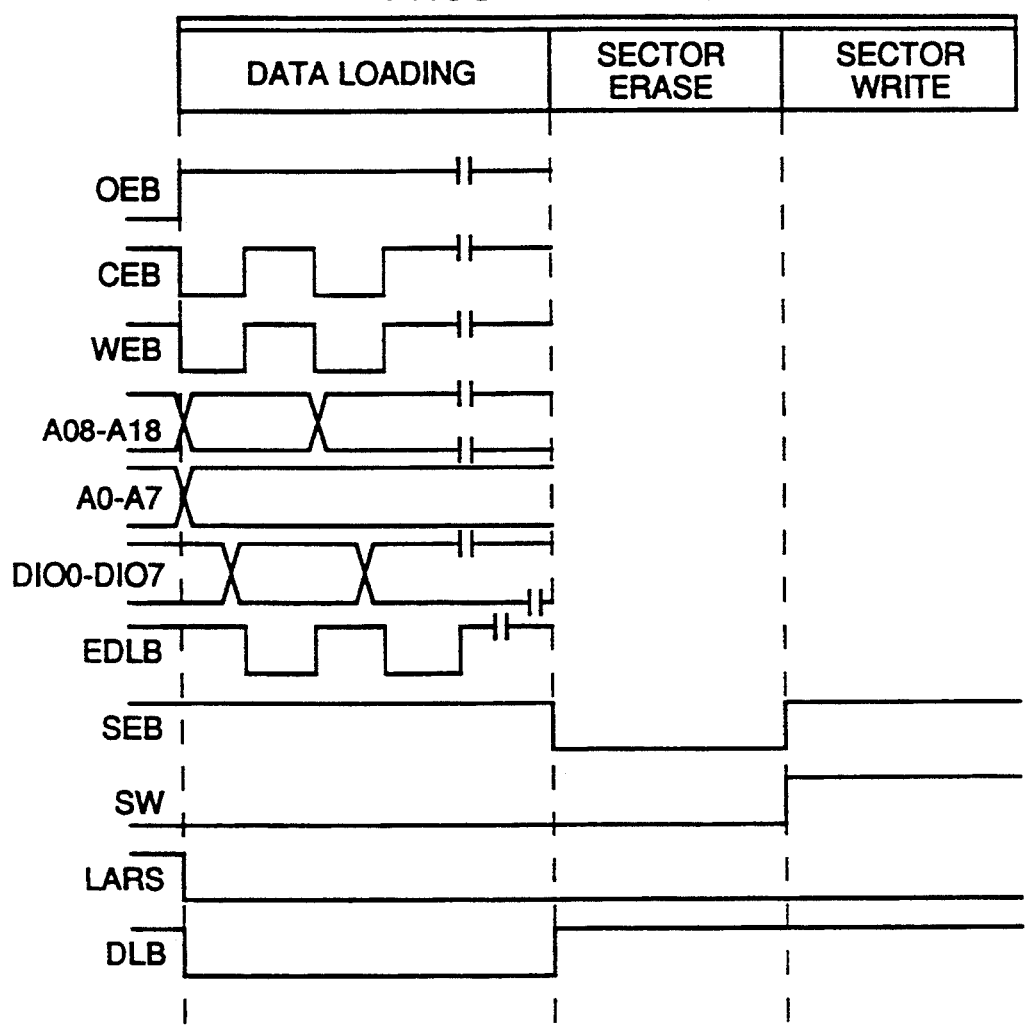
FIG. 11 is a diagram illustrating the timing relationships between various control and input/outputs of the circuits illustrated in FIGS. 1 and 3-9.

Referring now to the previously discussed figures of the drawing the operation of the memory can be more readily described. Programming the memory is done in three steps including loading the data into the data latch array 104, erasing the existing content of the memory sector to receive new data, and writing the data from the data latch row circuits 300 to the sector cells 200. The main signals for memory programming are shown in FIG. 11. Other signals required will be understood by those skilled in the art. The first operation of data loading is user dependent, requiring the user to change, according to his programming pattern, the column addresses A8 to A18 (126), the row addresses A8 to A18 (112), the data input/outputs DI00 to DI07 (136) and the control signals CEB (146), OEB (148) and WEB (150).

According to FIG. 11 the main signal for the data loading operation is DLB (data loading bar) which becomes active by a "1" to "0" transition. This signal is generated by control logic and timer 144 when input OEB (148) changes from "0" to "1", input CEB (146) changes from "1" to "0" and input WEB (150) changes from "1" to "0". Through bus 130 the DLB signal is connected to buffer (136) enabling it to receive sets of data 138. At the end of the data loading operation the control logic and timer 144 automatically recognizes that no additional data is being loaded and changes the DLB signal from "0" to "1" which disables the data input function of data input output buffer 136 so that additional data 138 can not be loaded into the data latch array 104. At the starting point of the data loading operation the identification of a selected sector to be programmed with new data is required. This is done by application of a selected set of "1" and/or "0" logic levels to inputs A0 to A7, which selects a single sector for programming. The logic levels are latched into the column address buffer 124 by a column latch address signal. The column latch address signal is not shown in FIG. 1 but is generated by the control logic and timer 144 at the starting point of the data loading operation, and is connected to the column address buffer 124 through bus 130. The column latch address signal secures a set of stable addresses 126 for the entire programming cycle so that all the operations related to the programming cycle in progress will be exercised on the initially selected sector. The selected combination, applied to inputs A0 to A7, is latched into the column address buffer 124 and connected through bus 128 to the column address decoder 122, which in turn activates a single sector select line in bus 120. (There are $2^n = 28 = 256$ sector select lines in bus 120 corresponding to 256 sectors in the array.) The activated sector select line in bus 120 activates a single sector, the selected sector, through the sector select circuitry 114, the bus 118, the bit line select circuitry 113 and bus 116. All the non-selected sectors of the memory array 100 are deactivated by the sector select circuit 114 and bit line select circuit 113 through the buses 118 and 116 with signals protecting them from any programming activity.

As shown in FIG. 11, during the data loading operation there are a number of CEB (146) and WEB (150) cycles. During each CEB, WEB cycle a set of S data (8 in our example) is transferred from DIO0-DIO7 (138), through the data input-output buffer 138 and the data bus 140 to a data latch row 300 located in the data latch array 104. The number of CEB, WEB cycles necessary to load the data latch array 104 with data, is equal to the total number of data latch rows in the array 104, which is equal to the total number of address combinations A08 to A18, equal to $2^n = 2^{11} = 2048$ for the illustrated case. In fact, the invention includes any number of address combinations and corresponding data latch rows, etc.

For each CEB, WEB cycle a separate set of addresses A08 to A18 is required, which through the row address buffer 110, the bus 108, the row address decoder 102 and the word line bus 106 activates a single data latch row 300 in the array 104. This set of addresses A08 to A18 has to be stable during a CEB, WEB cycle. In order to assure that this requirement is met, the control logic and timer 144 generates a row address latch signal (not shown but included in bus 130) from the "1" to "0" transition of every CEB, WEB cycle. The row address latch signal directs the set of addresses A08 to A18 to the row address buffer 110 and maintains this set of addresses stable during the CEB, WEB cycle, and disconnects the inputs A08 to A18(112) from the row address buffer 110, which allows the user the opportunity to prepare a new set of A08 to A18 addresses 112 for the next CEB, WEB cycle.

As FIG. 11 shows, for every CEB, WEB cycle a new set of S data is required at the inputs DI00 to DI07 (138). This set of data has to be stable for the second half of the CEB, WEB cycle. In order to assure that this requirement is met, the control logic and timer 144 generates an active data latch signal at every CEB, WEB "0" to "1" transition and applies it to the data input output buffer 136. The data latch signal directs the set of data 138 to the data input output buffer 136, and keeps the data stable in the buffer for the second half of the CEB, WEB cycle. It also disconnects DIO0 to DIO7 inputs 138 from the data input output buffer 136 for the second half of the WEB, CEB cycle so that the user can use the second WEB, CEB half cycle to prepare a new set of data for the following CEB, WEB cycle. As FIG. 11 shows, the enable data latch bar signal EDLB goes through a number of cycles equal to the number of WEB, CEB cycles. The EDLB signal is generated by the control logic timer 144 and is connected to the data latch array 104 through the bus 130, the high voltage generator 132 and bus 134. When EDLB is "0", the connection between the data input output buffer 136 and data latch array 104 is enabled through bus 140, and the set of S data latched in 136 is transferred into the data latch row 300 (located in the data latch array 104). As one skilled in the art can see from the above discussion, the CEB, WEB cycle has two main functions to perform. In the first half cycle a single data latch row 300 is activated, and the data to be stored in it is taken into the data input output buffer 136. In the second half of the cycle the data is transferred from the data input output buffer 136 to the selected (activated) data latch row 300. The data loading operation is repeated for every CEB, WEB cycle until all 2048 sets of data are stored in the 2048 data latch rows of the data latch array 104. If no other CEB, WEB cycles arrive at inputs 146 and 150 for a certain period of time, the control logic and timer 144 recognizes that the data loading operation is complete and automatically changes the data loading signal DLB from "0" to "1".

The erase operation, as FIG. 11 shows, starts after the data loading operation is completed. The erase operation is started by the sector erase bar SEB signal changing from "1" to "0". This signal is generated automatically by the control logic and timer 144 and it is the main signal for the sector erase operation. The SEB signal is not shown in FIG. 1, but is included in bus 130. The SEB signal is connected to the high voltage generator 132 through bus 130, and through bus 130 and bus 134 to the sector select circuitry 114, the bit line select circuit 113 and the data latch array 104. As mentioned earlier, during the data loading the sector to be programmed is selected and remains selected for the entire programming cycle. During sector erase the sector select line SSL of the selected sector is brought to 0 volts by the sector select circuitry 114 and bus 118. The erase operation then proceeds as follows:

The sector select lines for the non-selected sectors are brought to VPI by the sector select circuit 114 of FIG. 1. The bit line select circuit 113 disconnects the bit lines, leaving the voltage floating, and the high voltage pump and word line driver circuitry 402 of FIG. 4 applies voltage VPP to all word lines. This accomplishes the erase of the selected sector by applying a voltage differential of VPP from the gate to source of each cell transistor in the selected sector as set out in FIG. 10. In the non-selected sector, the voltage differential is VPP—VPP/2 which is not enough to erase the cell data.

During the erase operation, all the control gates of the memory EEPROM cells are connected to the word lines 212 which have the VPP voltage impressed upon them, and all of these cells conduct current in that condition because VPP is much higher than the cell threshold voltage. As above noted, all the bit lines of the array, including selected and non-selected sectors, are floating during erase, but because the EEPROM cells are conductive with VPP on the control gate, the bit lines receive the voltages of the sector select lines 218 which are connected to the cell sources. The bit lines of the selected sector are therefore at the voltage level of SSL0 which is zero volts, and the bit lines of the non-selected sectors are at the voltage level of the non-selected sectors SSLI lines, which is VPI.

After the erase of the selected sector, all of the cells of the selected sector have a threshold voltage larger than VCC by 1 or 2 volts and will not conduct current during a read operation. The cells of the remaining (non-selected) sectors are not affected by the erase operation of the selected sector.

The sector erase operation is automatically ended by the control logic and timer 144 which causes a "0" to "1" transition on signal SEB.

Circuit 144 automatically starts the last operation of the programming cycle, the sector write operation. As FIG. 11 shows, the main signal for the sector write operation is the sector write signal SW, which becomes active by a "0" to "1" transition caused by the control logic and timer 144. The SW signal is not specifically shown in FIG. 1 but is included in bus 130, and is passed through this bus to the high voltage generator 132, and through bus 130 and bus 134 to the bit line select circuitry 113, the sector select circuitry 114, and the data latch array 104.

The writing or transferring of data from the data latches to the cells of a selected sector is done one bit line at a time, transferring simultaneously all data in a particular column of the data latch array 104 to all of the cells within a selected sector that are connected to a selected bit line, and then repeating the operation for each of the remaining data latch array columns and bit lines in the sector. The bit line select circuit 113, bit line switch 115 and the sector select circuit 114 are operative to cause VPP to be applied to the bit line 216 attached to the cells to be programmed, and the sources of all sectors and non-selected bit lines are set in the floating state. The data latch row circuitry of each row 300 then responds to the data in the first latch DL0 and applies a VPI voltage to the word line if the data is "1", and zero volts to the word line if the data is "0". The application of a zero voltage on a word line results in a voltage differential of VPP −0=VPP from the drain to the gate of the particular cell connected to the word line and the selected bit line, which writes data into the cell. The application of the VPI voltage on a word line results in a voltage differential of VPP−VPI=VPP−VPP/2=VPP/2 from the drain to the gate of the cell connected to the word line and the selected bit line, which is not enough voltage to change the state of the cell, leaving it in the erased condition. As indicated above, all of the cells in one bit line are written simultaneously. Then circuits 113, 114 and 115 select the next bit line, and the shift data circuit 314 shifts the data from the second latch column into the position of the first latch column and the procedure in repeated until all of the cells of the selected sector have been written. At this point, the write operation is completed automatically by the control circuit and timer 144 through a "1" to "0"transition of the SW signal. Through the CEB, WEB and OEB signals, the user can start a new memory read or programming operation.

Figure 12B:
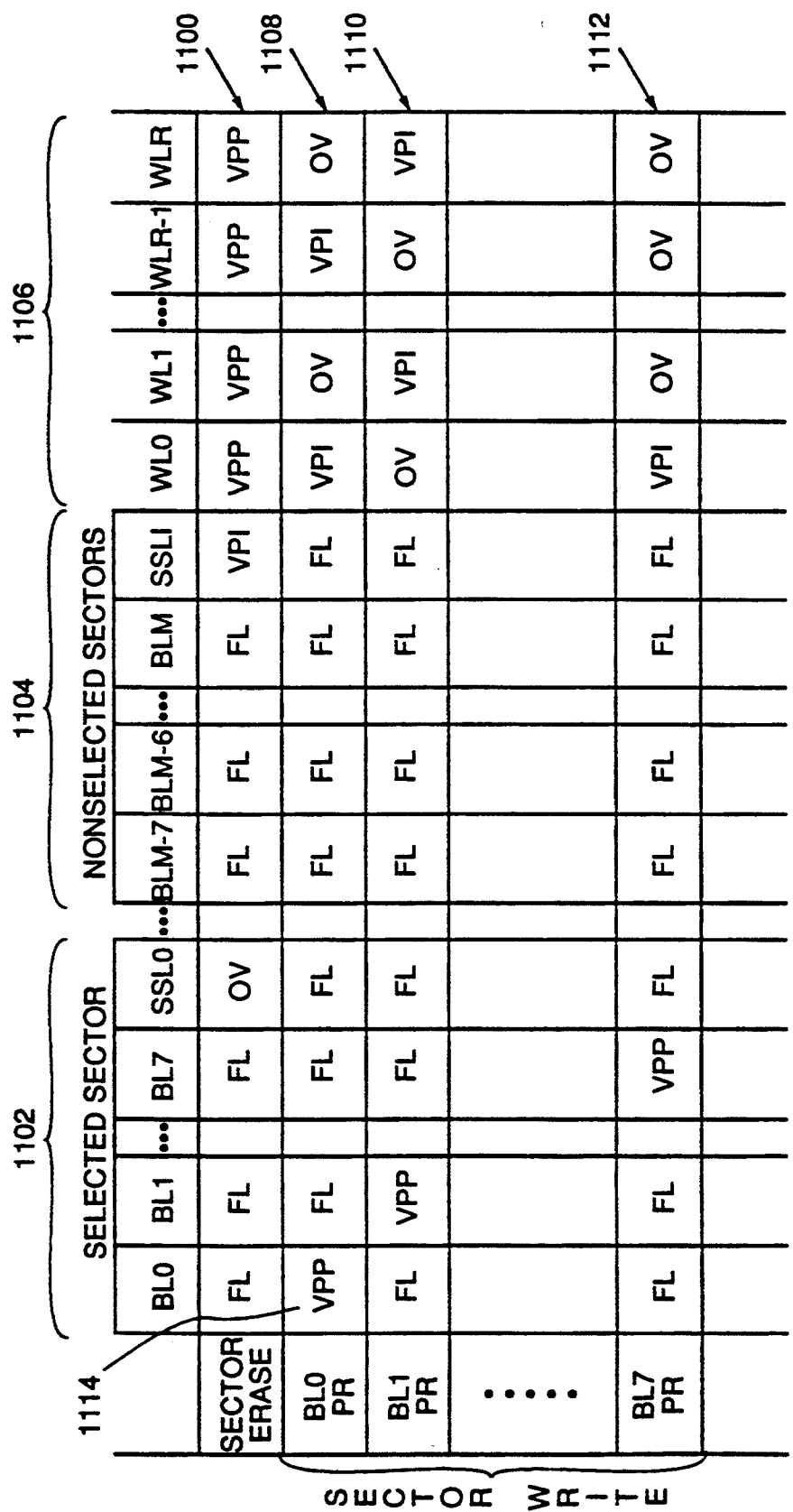
FIG. 12B is a tabulation of the various voltages necessary to write the data of FIG. 12A into memory.

FIGS. 12A and 12B display an example of the programming of one selected sector of an array. The example depicted in FIG. 12A gives the logic level for the data to be programmed for a sector with eight bit lines, but for ease of illustration, only the data for three of the bit lines (BL0, BL1 and BL7) and four word lines (WL0, WL1, WLm-1, and WLm) are given. FIG. 12B shows the voltages necessary to program the data of FIG. 12A in the selected sector. The selected sector bit line BL and sector select line SSL voltages are given under "selected sector" 1102. The non-selected sector voltages 1104, and the voltages to be applied to the word lines 1106 are also displayed.

The voltages for sector erase are given in row 1100.

The sector write operation voltages are given in rows 1108–1112. The voltages for the first "write" step, for programming the first bit line BL0, are summarized in row 1108. As illustrated at 1114, the selected bit line is connected to VPP, and the other bit lines (BL1–BL7) and the SSL0 line of the sector are disconnected and floating, as illustrated at 1102. In column 1104, the bit lines and sector select lines of the non-selected sectors are shown to be floating. The voltage levels applied to the word lines determine the data, "1" or "0", to be written into a particular cell at the intersection of a bit line and word line. As illustrated, the cells to be written with a "0" have their word lines connected to zero volts, and the cells to be written a "1" have their word lines connected to VPI, which is an inhibit voltage causing the cell to remain unchanged from the state following the erase operation which put all the cells into the "1" state.

Figure 13:
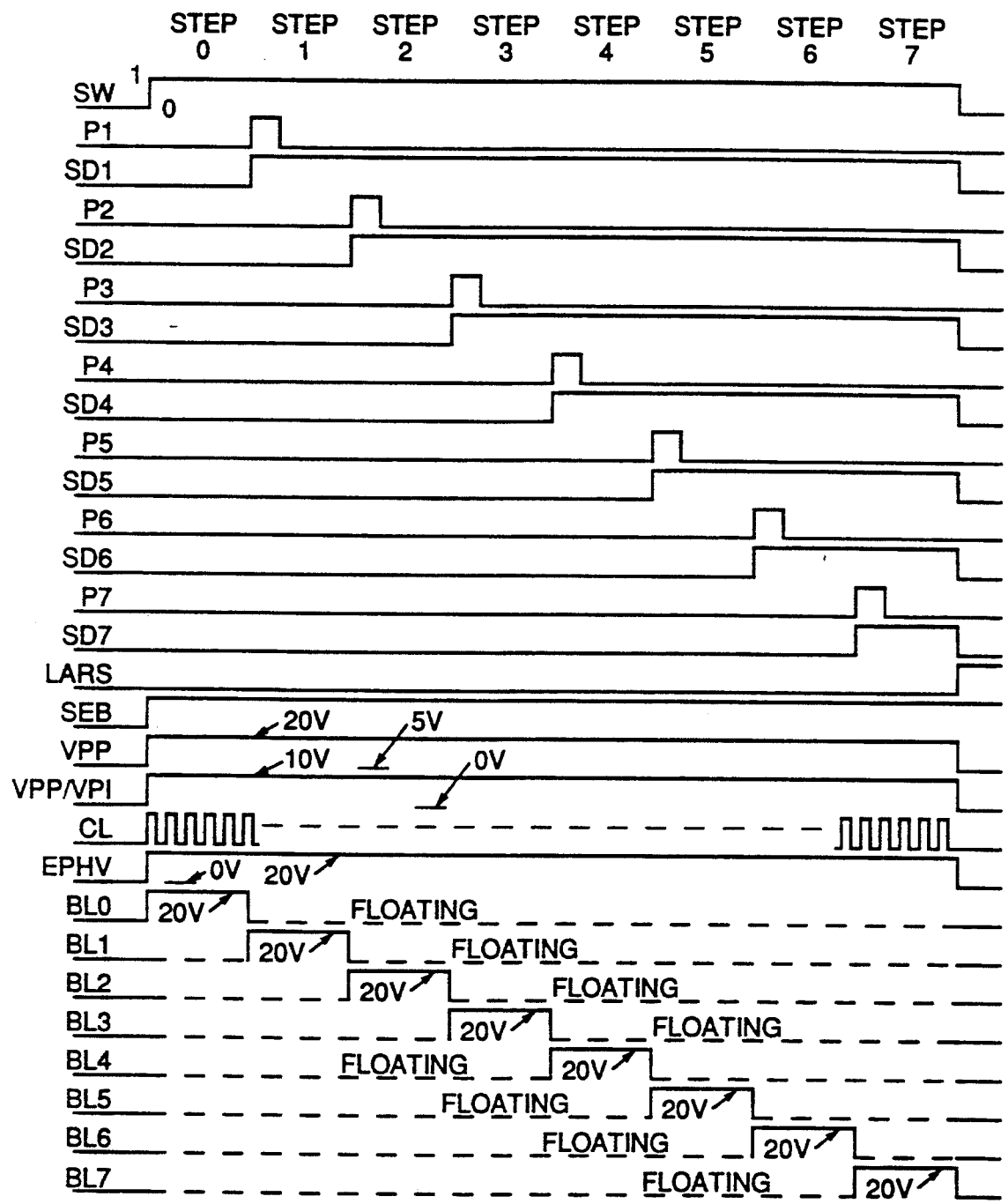
FIG. 13 is a timing diagram illustrating the operation of writing data into the memory.

FIG. 13 is a timing diagram showing the status of the signals related to the data latch row during a sector write operation. The SW (sector write) signal becomes active at the beginning of the sector programming operation and stays active for the whole duration. During step 0, the data stored in the first latches DL0 of each Data Latch Row 300 (the first column of latches) are transferred from the latches 410, through the word lines 212 to the cells 200 within a selected sector connected to the bit line BL0 216. The drains 204 of each such cell are connected to the bit line BL0, and the control gate 206 of each such cell 200 is connected to the corresponding word line 212. During this step the data stored in each latch DL0 of the first column of latches is transferred to the cells connected to the bit line BL0, and only BL0 is connected to VPP, with all the other bit lines floating. During this step, all of the transmission gates TR1–TR7 are non-conducting, or "off", because all the signals SD1 to SD7 are "0" and all the signals SD1B to SD7B are "1".

After the data stored in the first data latches DL0 are transferred to the cells connected to the bit line BL0, step 0 is complete, and the second step (step 1), is started by the pulse signal P1. The pulses P1, P2, . . . P7 are generated by an interval timer (not shown) and connected to the inputs 218 of FIG. 9A. The bit line BL1 then takes the VPP voltage level and all other bit lines are left floating. At the same time, signal SD1 becomes active "1" and data latch 0 is connected to data latch 1 (DL1). The data stored in the data latch 1 is transferred by the data latch 0 through the transmission gate TR1. From the data latch 0, the data is transferred to the cells connected to the bit line BL1 in a manner similar to that described in step 0. The pulse P2 generated by the timer defines the end of step 1 and the beginning of step 2. The SD2 signal then becomes active "1" and SD1 keeps its active status, and through TR1 and TR2 latch 0 receives the data stored in latch 2 in order to transfer it to the cells connected to the bit line BL2. This sector write programming operation continues until all the data stored in the latch array is transferred to the selected sector. The above description illustrates a serial approach to data transfer between latches and memory cells. First, all the data stored in the data latches 0 (latch column 0), corresponding to the received through input-output line DI00 are transferred in parallel to the cells within a selected sector connected to the bit line BL0. Then all the data stored in the column of data latches 1 are transferred to the column of data latches 0, and from there are transferred to the cells connected to bit line 1. After that all the data stored in data latches 2 are transferred to data latches 1, and from there to the data latches 0, and from data latches 0 to the EEPROM cells connected to bit line 2 (BL2). This approach to programming is called bit line sector page programming. The name bit line sector means that every sector of the array has distinct bit lines, but the word lines of the sector are the same as the word lines of all other sectors of the array.

Although a preferred embodiment of the present invention has been described above, it will be appreciated that certain alterations and modifications thereof will become apparent to those skilled in the art. It is therefore intended that the appended claims be interpreted as covering all such alterations and modifications as fall within the true spirit and scope of the invention.

What is claimed is:

1. An EEPROM memory device comprising:
   a plurality R of word lines;
   a word line select bus for facilitating the selection of one of said word lines;
   an input-output bus including S lines for facilitating the simultaneous input or output of S data bits;
   a data latch array means including R rows and S columns of data latches, each latch having a latch input and a latch output, with each row of data latches being associated with a particular one of said R word lines and each column of said S columns of data latches being associated with one of said S lines of said input-output bus;
   a plurality of bit lines;
   a plurality of sector select lines; and
   a memory array including a plurality of EEPROM memory cells organized in N sectors of R rows of S columns of memory cells with corresponding rows of memory cells in each said sector being connected to a particular row of said data latches by a particular one of said R word lines, and the memory cells in each said column being connected to one of said bit lines, and each memory cell in a particular sector being connected to one of said sector select lines;
   coupling means for coupling said bit lines to said input/output bus;
   whereby data to be loaded into said memory array is first loaded, S bits at a time, to the latches of each said row of latches;
   whereby data contained in each said column of said data latch array is thereafter transferred a column at a time in parallel over said R word lines to said memory cells and stored in a particular column thereof selected by an input to a particular one of said bit lines in a sector of said memory array selected by an input on a particular one of said sector select lines; and
   whereby upon demand data stored in said memory array may output S bits at a time in parallel via said bit lines and said coupling means to said input-output bus.

2. An EEPROM memory device as recited in claim 1 and further comprising:
   bit line addressing means responsive to control input signals, column address signals, and voltage supply signals to select a particular one of said sectors by applying a signal to a particular one of said sector select lines, and to activate a particular one of said bit lines within said selected sector by applying a signal to said bit line.

3. An EEPROM memory device as recited in claim 2, wherein said bit line addressing means further includes:
   a column address buffer means for receiving said column address signals, and in response to said control signals providing corresponding buffer output signals;
   a column address decoder means responsive to said control signals to receive said buffer output signals and to provide decoded output address signals;
   a sector select circuit means responsive to said control signals and to said decoded output address signals, and to voltage supply signals to select a particular one of said sectors by applying a signal to a particular one of said sector select lines; and
   a bit line select circuit means responsive to said control signals and to said decoded output address signals, and to said voltage supply signals to activate a particular one of said bit lines within said selected sector by applying a signal to said bit line.

4. An EEPROM memory device as recited in claim 1 wherein said data latch array means further includes:
   a transmission gate switchably interconnecting each latch in each row of S latches, said gates responsive to gate input signals to sequentially transfer data from each latch to a first latch in said rows, said first latches of all R rows forming a first column of latches, whereby said data in said first column of latches is in position to be transferred to said memory cells.

5. An EEPROM memory device as recited in claim 4 and further comprising a shift data logic circuit means responsive to control signals for supplying said gate input signals to said transmission gates.

6. An EEPROM memory device as recited in claim 1 and further comprising a high voltage generator means having an input responsive to said control signals and an output providing said voltage supply signals.

7. An EEPROM memory device as recited in claim 6 and further comprising a plurality of R high voltage pump circuit means with one of said circuit means being associated with each of said R rows of word lines and corresponding data latch rows, each said circuit means being responsive to the data latch output of a corresponding first data latch and to said control signals and to said voltage supply signals, and operative to apply a programming voltage to its corresponding word line to write data from a first data latch into a memory cell associated with a corresponding word line and a selected bit line.

8. An EEPROM memory device as recited in claim 1 further comprising a sector erase means responsive to control signals to erase data stored in the memory cells of a selected sector, said erase means including:
  selecting means responsive to control signals for activating a selected sector by applying activating signals to a particular sector select line and a particular bit line of said selected sector;
  de-selecting means responsive to said control signals for de-activating non-selected sectors by applying a de-activating signal to the sector select lines and the bit lines of said nonselected sectors; and
  means for applying erase signals to said word lines to erase data contained in the memory cells of said selected sector.

9. An EEPROM memory device as recited in claim 6 wherein said high voltage pump means further includes means responsive to said control signals and said voltage supply signals to apply an erase voltage to said word lines to erase data stored in the memory cells of one of said selected sectors.

10. An EEPROM memory device as recited in claim 1 wherein each row of said data latches has an activating input for providing a row of activated data latches to receive data input.

11. An EEPROM memory device as recited in claim 10 wherein said data latch array means further includes an enable data latch logic circuit means for receiving a group of S data and storing said data in S enable data latches, and in response to a control signal, outputting said S data to be received by said row of activated data latches.

12. An EEPROM memory device comprising:
  a plurality of R word lines, each word line having a word line input;
  a plurality of M bit lines, each bit line having a bit line input;
  a plurality of N sector select lines, each sector select line having a sector select line input;
  R rows of M columns of EEPROM transistor data storage cells, each said cell having a drain, a source, and a gate and organized in N sectors of R rows of S columns of data storage cells with each cell of corresponding rows of cells in each sector having its gate connected to a particular one of said R word lines, and all of the cells of each column of cells having their drains connected to a particular one of said M bit lines, and all of the cells in each sector having their sources connected to a particular one of said N sector select lines, where R, S, M and N are integers;
  control logic and timer means responsive to user supplied inputs and operative to generate control signals;
  a data latch array means including R sub arrays of latches responsive to said control signals each sub-array being operative to temporarily store a group of S data, each sub-array being associated with a particular one of said R word lines;
  data input/output means responsive to said control signals for receiving and supplying groups of S input data to said data latch array, and for outputting groups of S output data from said data storage cells;
  column address means responsive to said control signals and to user input address signals for selecting one of said sectors;
  programming means responsive to said control signals for transferring data from said data latch array means to cells of a selected sector via said word lines;
  row address means responsive to user input address signals and said control signals, and operative to select one of said R rows; and
  data read means responsive to said control signals for detecting and outputting groups of S output data from the selected row of a selected sector via said bit lines to said data input/output means.

13. An EEPROM memory device as recited in claim 12 wherein said programming means includes:
  sector erase means responsive to said control signals for erasing data stored in a selected sector; and
  sector write means responsive to said control signals for writing data in said data latch array into the cells of said selected sector and including means for application of write voltage signals corresponding to the data in said data latch array to said word lines.

14. An EEPROM memory as recited in claim 13 wherein said sector erase means includes sector erase voltage supply means responsive to said control signals for applying a first predetermined voltage between the gate and drain of each cell of said selected sector of a value sufficient to erase any data stored therein, and for simultaneously applying a second predetermined voltage less than said first predetermined voltage between the gate and drain of the cells of the non-selected sectors, said second predetermined voltage being a value insufficient to erase the data in the cells of the non-selected sectors.

15. An EEPROM memory as recited in claim 13 wherein said sector erase means includes:
  word line voltage supply means responsive to said control signals for applying a first predetermined voltage to said R word lines;
  bit line connection supply means responsive to said control signals for electrically disconnecting said bit line inputs; and
  sector select line erase voltage supply means responsive to said control signals for applying a zero voltage to the sector select line of said selected sector, and for applying a second predetermined voltage to the sector select lines of the nonselected sectors;
  whereby said first predetermined voltage is applied between the gate and source of each cell of said selected sector; and wherein said first predetermined voltage is of a value sufficient to cause the cells to conduct between the source and drain, and sufficient for erasing the data in the cells in said selected sector, and a voltage equal to the difference between said first and second predetermined voltages is applied between the gate and drain of the cells of said non-selected sectors, said voltage being insufficient to erase the data from the cells.

16. An EEPROM memory as recited in claim 13 wherein said sector write means includes:
sector select line connection means responsive to said control signals for electrically disconnecting said sector select line inputs;
bit line select means responsive to said control signals for applying a first pre-determined voltage to one selected bit line of the S bit lines in said selected sector of a value sufficient to allow data to be written into the R cells connected to said selected bit line, and for electrically disconnecting the bit line inputs to the remaining bit lines;
row voltage supply means responsive to said control signals for applying a write voltage signal corresponding to one of the S data in each of the R sub-arrays of latches to each of said associated word lines for writing a group of R data from said data latch array into the R cells connected to said selected bit line; and
means for directing said bit line select means and row voltage supply means to repeatedly transfer selected columns of R data, one column at a time from said data latch array to a column of R cells in said selected sector until all of the data in said data latch array is written into the cells of said selected sector.

17. An EEPROM memory as recited in claim 16, wherein said write voltage signal is zero volts if said one of the S data is a "low" logic level, causing said first pre-determined voltage to be applied between said drain and said gate, of sufficient value to write said data into said cell, and wherein said write voltage signal is a second pre-determined voltage causing a voltage equal to the difference between said first and said second pre-determined voltages to be applied between said drain and said gate when said data is a "high" data logic level, said second pre-determined voltage being of a value so that the cell remains in an erased state.

18. An EEPROM memory as recited in claim 12 wherein said data read means includes means for application of read voltages to said data storage cells.

19. An EEPROM memory as recited in claim 18 wherein said means for application of read voltages includes:
means for applying a zero voltage to said sector select lines;
means for applying a pre-determined voltage to the word line connected to the cells from which data is to be read; and
means for applying a voltage to the selected bit lines of magnitude so as to distinguish the difference in cell conductivity between a cell with data and a cell with no data written therein.

20. An EEPROM memory as recited in claim 16 wherein the transfer of selected columns of R data is accomplished so that the selected column of R data in the data latch array is all simultaneously written into the R cells of the selected bit line of the selected sector.

21. An EEPROM memory as recited in claim 12 wherein said data input/ output means further includes:
an input output buffer means responsive to said control signals for receiving a group of S data; and
an input/output data bus line for transferring said group of S data to said data latch array.

22. An EEPROM memory as recited in claim 12 wherein each said sub-array of latches includes:
latch reset means for clearing data from a sub-array of latches;
word line activation means for selectively activating one said sub-array of latches to receive a group of S data; and
wherein said data input/output means further includes means for providing for each sub-array of latches to receive a group of S data.

23. An EEPROM memory as recited in claim 17, each of said sub-array of latches having
a plurality of S data latches, including a first data latch, and each latch for storing one data bit, and each latch having
a data transfer output for providing access to said data in said latch;
a latch reset means responsive to said control signals to clear data from said latch;
a latch activation means responsive to said control signals to activate said latch to receive new data;
a new data input for receiving a new data bit from said data input/output means;
a plurality of S-1 transmission gates, each gate having
a gate input;
a gate output;
a gate control input;
whereby said transmission gate is responsive to said control signals applied to said gate control input to connect or disconnect said gate input from said gate output; and
wherein said S data latches are switchably interconnected in series through said S-1 transmission gates, the data transfer output of one latch connected to the gate input of one of the transmission gates, the gate output of which is connected to the data transfer input of another data latch, this sequence repeated, resulting in the series interconnection of all of the latches and transmission gates, with the latch at one end having its data transfer input receiving data from the preceding latch designated as a first data latch; and
a high voltage pump and word line drive means including a drive input connected to the data transfer output of said first data latch;
a drive output connected to a particular corresponding word line; and
wherein said drive means is responsive to said control signals and to a data bit stored in said first data latch for applying said write voltage signals through said drive output to said corresponding word line; and
whereby said data latches of each of said R sub-array of latches are cleared of data by receiving a signal from said control logic and timer means applied to said latch reset means, and said data latches are activated to receive data from said data input/output means upon receipt of a signal from said control logic and timer means applied to said latch activation means, and said high voltage pump and word line driver means of each of said R sub-array of latches, upon receipt of control signals from said control logic and timer means responds to data in said first latch and applies a write signal voltage to said corresponding word line, resulting in R data of said data latch array being written into R cells of said selected bit line of said selected sector, and said transmission gates upon receipt of signals directed by said control logic and timer means cause the transfer of data in the next latch to be transferred to said first latch, and said high voltage pump and word line driver applies said write signals to said word lines to write the data into the cells connected to another selected bit line, and the process of transferring data into said first latch and writing data into the cells connected to a selected bit line is repeated until all of the S data in each of the R sub-arrays of latches is written into the cells of said selected sector.

24. An EEPROM memory as recited in claim 23 wherein said sector erase means includes:
  word line voltage supply means responsive to said control signals for applying a sector erase word line voltage to said R word lines;
  bit line connection means responsive to said control signals for electrically disconnecting said bit lines; and
  sector select line erase voltage supply means responsive to said control signals for applying a zero voltage to the sector select line of said selected sector, and for applying an inhibit sector erase voltage to the sector select lines of the non-selected sectors;
  whereby said sector erase word line voltage is applied between the gate and source of each cell of said selected sector; and
  wherein said sector erase word line voltage is of a value sufficient to cause the cells to conduct between the source and drain, and sufficient for erasing the data in the cells in said selected sector, and a voltage equal to the difference between said sector erase word line voltage and said inhibit sector erase voltage is applied between the gate and drain of the cells of said non-selected sectors, said voltage being insufficient to erase the data from the cells.

25. An EEPROM memory as recited in claim 23 wherein said high voltage pump and word line driver means further includes means responsive to said control logic and timer means for applying said sector erase word line voltage to said R word lines.

26. An EEPROM memory device as recited in claim 7 wherein said high voltage pump means further includes means responsive to said control signals and said voltage supply signals to apply an erase voltage to said word lines to erase data stored in the memory cells of one of said selected sectors.

* * * * *